US012376376B2

(12) United States Patent
Han et al.

(10) Patent No.: US 12,376,376 B2
(45) Date of Patent: Jul. 29, 2025

(54) PIXEL CIRCUIT WITH SPECIFIC TRANSISTOR LAYOUT AND DISPLAY SUBSTRATE

(71) Applicants:CHENGDU BOE OPTOELECTRONICS TECHNOLOGY CO., LTD., Sichuan (CN); BOE TECHNOLOGY GROUP CO., LTD., Beijing (CN)

(72) Inventors: Linhong Han, Beijing (CN); Qiwei Wang, Beijing (CN); Yao Huang, Beijing (CN); Chao Zeng, Beijing (CN); Weiyun Huang, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 17/772,536

(22) PCT Filed: Apr. 28, 2021

(86) PCT No.: PCT/CN2021/090733
§ 371 (c)(1),
(2) Date: Apr. 28, 2022

(87) PCT Pub. No.: WO2022/226846
PCT Pub. Date: Nov. 3, 2022

(65) Prior Publication Data
US 2024/0206226 A1 Jun. 20, 2024

(51) Int. Cl.
*G09G 3/32* (2016.01)
*G02F 1/1362* (2006.01)
(Continued)

(52) U.S. Cl.
CPC ..... *H10D 86/441* (2025.01); *G02F 1/136286* (2013.01); *G09G 3/3233* (2013.01);
(Continued)

(58) Field of Classification Search
CPC .............. H10K 59/1213; H10K 59/131; G02F 1/136286; G09G 3/3233; G09G 3/3648;
(Continued)

(56) References Cited

U.S. PATENT DOCUMENTS 10,217,802 B2 * 2/2019 Hwang ................... H10K 59/35
10,304,918 B2 * 5/2019 Lee ....................... H10K 59/124
(Continued)

FOREIGN PATENT DOCUMENTS

CN 110265458 A 9/2019
CN 111613177 A 9/2020
(Continued)

*Primary Examiner* — Ajay Ojha
*Assistant Examiner* — Tsz K Chiu
(74) *Attorney, Agent, or Firm* — LEASON ELLIS LLP

(57) ABSTRACT

A display substrate and a display panel are provided. The display substrate includes a base substrate; a display region, on the base substrate and including a plurality of sub-pixels arranged in an array; each of the plurality of sub-pixels includes a light-emitting element and a pixel circuit that drives the light-emitting element to emit light, and the pixel circuit includes a driving sub-circuit, a data writing sub-circuit, a threshold compensation sub-circuit, and a reset sub-circuit; the reset sub-circuit includes a first reset transistor and a second reset transistor, the threshold compensation sub-circuit includes a threshold compensation transistor and a storage capacitor, an orthographic projection of the second reset transistor on the base substrate is between an orthographic projection of the first reset transistor on the base substrate and an orthographic projection of the threshold compensation transistor on the base substrate.

20 Claims, 12 Drawing Sheets

(51) Int. Cl.
*G09G 3/3233* (2016.01)
*G09G 3/36* (2006.01)
*H10D 86/40* (2025.01)
*H10K 59/121* (2023.01)
*H10K 59/131* (2023.01)

(52) U.S. Cl.
CPC ....... *G09G 3/3648* (2013.01); *H10K 59/1213* (2023.02); *H10K 59/131* (2023.02); *G09G 2300/0861* (2013.01); *G09G 2310/0251* (2013.01); *G09G 2310/061* (2013.01)

(58) Field of Classification Search
CPC ... G09G 2300/0861; G09G 2310/0251; G09G 2310/061; G09G 2300/0819; G09G 2300/0842; G09G 2310/0262; G09G 2310/08; G09G 3/32; H01L 27/1255; H01L 27/124
See application file for complete search history.

(56) References Cited

U.S. PATENT DOCUMENTS

| | | | | |
|---|---|---|---|---|
| 10,541,294 | B2* | 1/2020 | Hong | H10K 59/1216 |
| 10,833,140 | B1* | 11/2020 | Mo | H10K 50/82 |
| 11,308,864 | B1* | 4/2022 | Liao | G09G 3/32 |
| 11,640,787 | B2* | 5/2023 | Zhao | G09G 3/3225 |
| | | | | 345/214 |
| 2009/0101900 | A1* | 4/2009 | Chuang | G06F 3/042 |
| | | | | 257/E27.131 |
| 2010/0097334 | A1* | 4/2010 | Choi | G06F 3/0412 |
| | | | | 345/173 |
| 2013/0063040 | A1* | 3/2013 | Huang | H05B 45/60 |
| | | | | 315/232 |
| 2014/0292622 | A1* | 10/2014 | Lee | H10K 59/353 |
| | | | | 345/80 |
| 2015/0302934 | A1* | 10/2015 | Qi | G11C 19/184 |
| | | | | 377/68 |
| 2016/0049438 | A1* | 2/2016 | Murata | H01L 27/14621 |
| | | | | 257/229 |
| 2017/0345847 | A1* | 11/2017 | Kim | H10K 59/12 |
| 2017/0373131 | A1* | 12/2017 | Sato | H10K 59/8792 |
| 2018/0076273 | A1* | 3/2018 | Kim | H10K 59/122 |
| 2018/0137818 | A1* | 5/2018 | Kim | G09G 3/2003 |
| 2018/0231853 | A1* | 8/2018 | Yamamoto | G02F 1/13338 |
| 2019/0140030 | A1* | 5/2019 | Huangfu | H10K 59/122 |
| 2019/0279563 | A1* | 9/2019 | Hwang | G09G 3/3225 |
| 2019/0296099 | A1* | 9/2019 | Lee | H10K 50/844 |
| 2020/0243151 | A1* | 7/2020 | Li | G09G 3/2092 |
| 2021/0376026 | A1* | 12/2021 | Mou | G09G 3/2003 |
| 2022/0051627 | A1 | 2/2022 | Yang et al. | |
| 2022/0271107 | A1 | 8/2022 | Liu et al. | |
| 2022/0310010 | A1 | 9/2022 | Cheng et al. | |

FOREIGN PATENT DOCUMENTS

| | | | |
|---|---|---|---|
| CN | 111681549 A | 9/2020 | |
| CN | 111951729 A | 11/2020 | |
| CN | 112309332 A | 2/2021 | |
| CN | 112673475 A | 4/2021 | |
| IN | 111128080 A | 5/2020 | |
| WO | WO-2019026170 A1 * | 2/2019 | ............... G09G 3/20 |

* cited by examiner

PIXEL CIRCUIT WITH SPECIFIC TRANSISTOR LAYOUT AND DISPLAY SUBSTRATE

CROSS-REFERENCE TO RELATED PATENT APPLICATIONS

This application is a U.S. National Stage Application under 35 U.S.C. § 371 of International Patent Application No. PCT/CN2021/090733 filed Apr. 28, 2021, which is incorporated by reference in its entirety.

TECHNICAL FIELD

The embodiments of the present disclosure relate to a display substrate and a display panel.

BACKGROUND

With the rapid development of an organic light-emitting diode (OLED) in the display field, people's requirements for a display effect are getting higher and higher. Due to the advantages, such as high display quality, an application range of a high-resolution display device is becoming wider and wider. In the display field, the more critical technology is the design of a pixel circuit.

SUMMARY

At least one embodiment of the present disclosure provides a display substrate, including: a base substrate: a display region, on the base substrate and comprising a plurality of sub-pixels arranged in an array: each of the plurality of sub-pixels comprises a light-emitting element and a pixel circuit that drives the light-emitting element to emit light, and the pixel circuit comprises a driving sub-circuit, a data writing sub-circuit, a threshold compensation sub-circuit, and a reset sub-circuit; the driving sub-circuit comprises a control terminal, a first terminal, and a second terminal, and is configured to control a driving current flowing through the light-emitting element, the data writing sub-circuit is connected to the first terminal of the driving sub-circuit, a data line, and a scan signal line, and is configured to write a data signal provided by the data line to the first terminal of the driving sub-circuit in response to a gate scan signal provided by the scan signal line; the threshold compensation sub-circuit is connected to the control terminal and the second terminal of the driving sub-circuit, a first voltage line, and a first reset control signal terminal, and is configured to compensate the driving sub-circuit in response to a first reset control signal received by the first reset control signal terminal and the data signal written; and the reset sub-circuit is connected to the second terminal of the driving sub-circuit, a first light-emitting control signal line, an initial signal line, and a second reset control signal terminal, and is configured to apply an initial voltage provided by the initial signal line to the second terminal of the driving sub-circuit in response to a first light-emitting control signal provided by the first light-emitting control signal line and a second reset control signal received by the second reset control signal terminal: the reset sub-circuit comprises a first reset transistor and a second reset transistor, the threshold compensation sub-circuit comprises a threshold compensation transistor and a storage capacitor, an orthographic projection of the second reset transistor on the base substrate is between an orthographic projection of the first reset transistor on the base substrate and an orthographic projection of the threshold compensation transistor on the base substrate, and an orthographic projection of the storage capacitor on the base substrate is between the orthographic projection of the second reset transistor on the base substrate and the orthographic projection of the threshold compensation transistor on the base substrate.

For example, in the display substrate provided by at least one embodiment of the present disclosure, the pixel circuit further comprises a first light-emitting control sub-circuit and a second light-emitting control sub-circuit: the first light-emitting control sub-circuit is connected to the second terminal of the driving sub-circuit, a first terminal of the light-emitting element, and the first light-emitting control signal line, and is configured to apply the driving current to the light-emitting element in response to the first light-emitting control signal provided by the first light-emitting control signal line: and the second light-emitting control sub-circuit is connected to the first voltage line, the first terminal of the driving sub-circuit, and the second light-emitting control signal line, and is configured to apply a first voltage provided by the first voltage line to the first terminal of the driving sub-circuit in response to the second light-emitting control signal provided by the second light-emitting control signal line, the first light-emitting control signal line and the second light-emitting control signal line extend along a first direction, an orthographic projection of the first light-emitting control signal line on the base substrate is between an orthographic projection of the second light-emitting control signal line on the base substrate and the orthographic projection of the storage capacitor on the base substrate.

For example, in the display substrate provided by at least one embodiment of the present disclosure, the orthographic projection of the second light-emitting control signal line on the base substrate is between the orthographic projection of the first light-emitting control signal line on the base substrate and the orthographic projection of the storage capacitor on the base substrate.

For example, in the display substrate provided by at least one embodiment of the present disclosure, the first light-emitting control sub-circuit comprises a first light-emitting control transistor: an active layer of the threshold compensation transistor, an active layer of the first light-emitting control transistor, and an active layer of the second reset transistor are integrally formed: and a gate electrode of the first light-emitting control transistor and a gate electrode of the second reset transistor are parallel in the first direction.

For example, in the display substrate provided by at least one embodiment of the present disclosure, the gate electrode of the first light-emitting control transistor and the gate electrode of the second reset transistor are integrally formed with the second light-emitting control signal line.

For example, the display substrate provided by at least one embodiment of the present disclosure, further comprises a first connection line extending along the first direction, the first connection line is connected to second light-emitting control signal lines respectively corresponding to adjacent sub-pixels through holes penetrating an insulation layer.

For example, in the display substrate provided by at least one embodiment of the present disclosure, sub-pixels in an x-th column and sub-pixels in an (x+1)-th column are mirror-symmetrical: and an active layer of a first reset transistor of each sub-pixel in the x-th column and an active layer of a first reset transistor of each sub-pixel in the (x+1)-th column are both U-shaped structures, and the U-shaped structures share one side, wherein x is an odd or even number greater than 0.

For example, in the display substrate provided by at least one embodiment of the present disclosure, the first reset transistor comprises a first gate electrode and a second gate electrode, an active layer of the first reset transistor comprises a first channel region corresponding to the first gate electrode, a second channel region corresponding to the second gate electrode, and a first intermediate region between the first channel region and the second channel region, and the first channel region and the second channel region are connected through the first intermediate region: and the threshold compensation transistor comprises a third gate electrode and a fourth gate electrode, the active layer of the threshold compensation transistor comprises a third channel region corresponding to the third gate electrode, a fourth channel region corresponding to the fourth gate electrode, and a second intermediate region between the third channel region and the fourth channel region, and the third channel region and the fourth channel region are connected through the second intermediate region.

For example, in the display substrate provided by at least one embodiment of the present disclosure, the initial signal line comprises a first initial sub-signal line and a second initial sub-signal line extending along the first direction: an orthographic projection of the first intermediate region on the base substrate and an orthographic projection of the second initial sub-signal line on the base substrate at least partially overlap: and an orthographic projection of the second intermediate region on the base substrate and an orthographic projection of the first initial sub-signal line on the base substrate at least partially overlap.

For example, the display substrate provided by at least one embodiment of the present disclosure, further comprises a second connection line extending along a second direction, the first direction and the second direction intersect, the second connection line is connected to the first initial sub-signal line and the second initial sub-signal line through holes penetrating an insulation layer.

For example, in the display substrate provided by at least one embodiment of the present disclosure, an orthographic projection of the active layer of the first reset transistor on the base substrate and an orthographic projection of the second connection line on the base substrate at least partially overlap, and the orthographic projection of the first initial sub-signal line on the base substrate and the orthographic projection of the second initial sub-signal line on the base substrate at least partially overlap with the orthographic projection of the second connection line on the base substrate.

For example, in the display substrate provided by at least one embodiment of the present disclosure, the scan signal line extends along the first direction, and the orthographic projection of the storage capacitor on the base substrate is between an orthographic projection of the scan signal line on the base substrate and the orthographic projection of the second light-emitting control signal line on the base substrate.

For example, in the display substrate provided by at least one embodiment of the present disclosure, the data writing sub-circuit comprises a data writing transistor, and the second light-emitting control sub-circuit comprises a second light-emitting control transistor; an active layer of the data writing transistor and an active layer of the second light-emitting control transistor are integrally formed: a gate electrode of the data writing transistor and a gate electrode of the second light-emitting control transistor are parallel in the second direction.

For example, in the display substrate provided by at least one embodiment of the present disclosure, an orthographic projection of the gate electrode of the data writing transistor on the base substrate and an orthographic projection of the gate electrode of the second light-emitting control transistor on the base substrate are respectively on both sides of the orthographic projection of the storage capacitor on the base substrate, and are on a side of the orthographic projection of the first light-emitting control signal line on the base substrate close to the orthographic projection of the second light-emitting control signal line on the base substrate.

For example, in the display substrate provided by at least one embodiment of the present disclosure, the gate electrode of the data writing transistor and the scan signal line are integrally formed, and the gate electrode of the second light-emitting control transistor and the second light-emitting control signal line are integrally formed.

For example, the display substrate provided by at least one embodiment of the present disclosure further comprises a third connection line extending along the first direction, the third connection line is connected to scan signal lines corresponding to adjacent sub-pixels through holes penetrating an insulation layer.

For example, in the display substrate provided by at least one embodiment of the present disclosure, an orthographic projection of the first connection line on the base substrate, an orthographic projection of the third connection line on the base substrate and the orthographic projection of the second initial sub-signal line on the base substrate are arranged side by side in the second direction.

For example, in the display substrate provided by at least one embodiment of the present disclosure, the driving sub-circuit comprises a driving transistor, an active layer of the driving transistor, the active layer of the data writing transistor, the active layer of the second light-emitting control transistor, the active layer of the threshold compensation transistor, the active layer of the first light-emitting control transistor, and the active layer of the second reset transistor are integrally formed.

For example, in the display substrate provided by at least one embodiment of the present disclosure, an orthographic projection of the active layer of the driving transistor on the base substrate overlaps the orthographic projection of the storage capacitor on the base substrate.

For example, in the display substrate provided by at least one embodiment of the present disclosure, the first voltage line comprises a first sub-voltage line extending in the second direction and a second sub-voltage line extending in the first direction, an orthographic projection of the first sub-voltage line on the base substrate is between an orthographic projection of sub-pixels in an (x+1)-th column on the base substrate and an orthographic projection of sub-pixels in an (x+2)-th column on the base substrate, and at least partially overlaps with an orthographic projection of the active layer of the data writing transistor on the base substrate and an orthographic projection of the active layer of the second light-emitting control transistor on the base substrate: and the second sub-voltage line is integrally formed with a second electrode of the storage capacitor, x is an odd or even number greater than 0.

For example, in the display substrate provided by at least one embodiment of the present disclosure, the data line extends along the second direction, an orthographic projection of the data line on the base substrate is on a side of the orthographic projections of the active layer of the data writing transistor and the active layer of the second light-emitting control transistor on the base substrate away from the orthographic projection of the first sub-voltage line on the base substrate.

For example, in the display substrate provided by at least one embodiment of the present disclosure, first reset terminals of pixel circuits in a y-th row and second reset terminals of pixel circuits in a (y−1)-th row are connected to a first reset signal line: and first reset terminals of pixel circuits in a (y+1)-th row and second reset terminals of the pixel circuits in the y-th row are connected to a second reset signal line: the first reset signal line is formed integrally with gate electrodes of the threshold compensation transistors of the pixel circuits in the y-th row and gate electrodes of the first reset transistor of the pixel circuits in the (y−1)-th row: the second reset signal line is formed integrally with gate electrodes of the threshold compensation transistors of the pixel circuits in the (y+1)-th row and gate electrodes of the first reset transistor of the pixel circuits in the y-th row; and the orthographic projection of the storage capacitor on the base substrate is between an orthographic projection of the first reset signal line on the base substrate and an orthographic projection of the second reset signal line on the base substrate, y is an integer greater than 1.

At least one embodiment of the present disclosure also provides a display panel including the display substrate provided by any embodiment of the present disclosure.

BRIEF DESCRIPTION OF THE DRAWINGS

In order to clearly illustrate the technical solutions of the embodiments of the present disclosure, the drawings of the embodiments will be briefly described in the following: it is obvious that the described drawings are only related to some embodiments of the present disclosure and thus are not limitative to the present disclosure.

DETAILED DESCRIPTION

Figure 1:
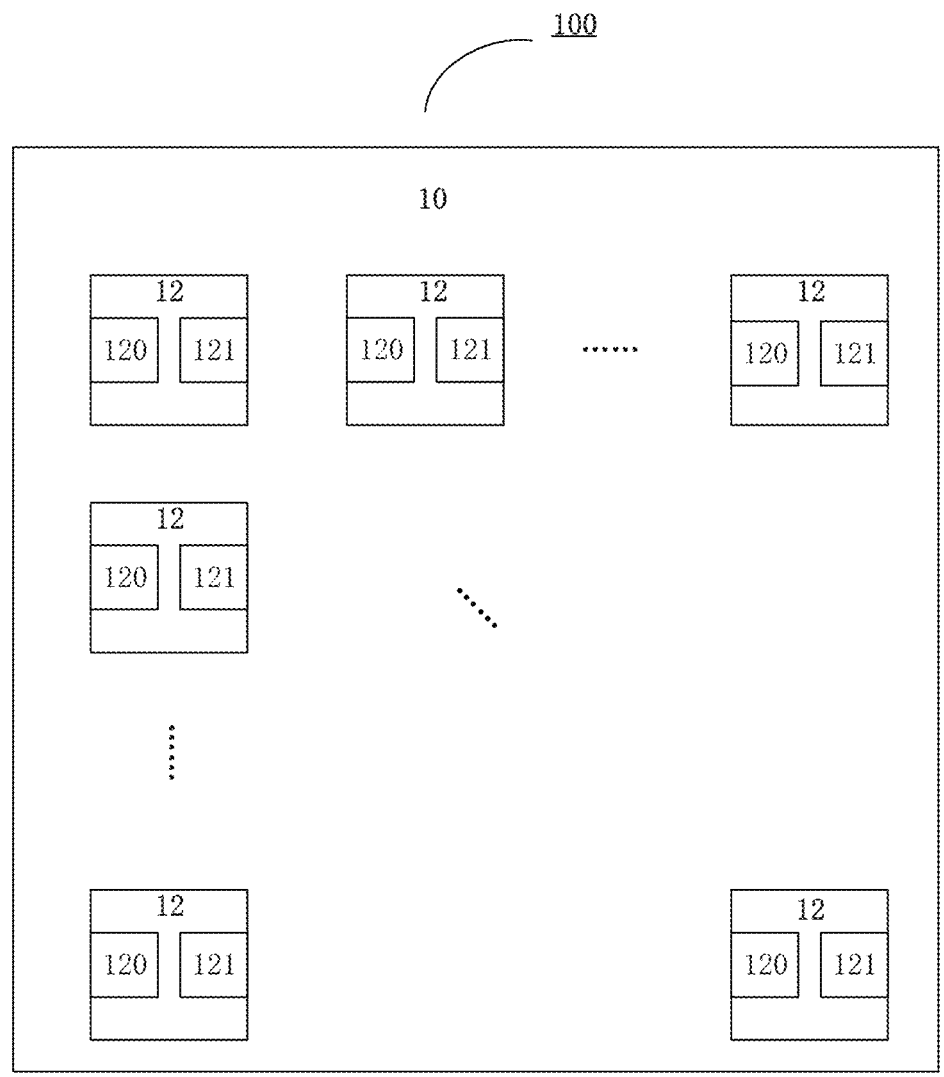
FIG. 1 is a schematic block diagram of a display substrate provided by some embodiments of the present disclosure.

In order to make objects, technical solutions, and advantages of the embodiments of the present disclosure apparent, the technical solutions of the embodiments of the present disclosure will be described in a clearly and fully understandable way in connection with the drawings related to the embodiments of the present disclosure. Apparently, the described embodiments are just a part but not all of the embodiments of the present disclosure. Based on the described embodiments of the present disclosure, those skilled in the art can obtain other embodiment(s), without any inventive work, which should be within the scope of the present disclosure.

Unless otherwise defined, all the technical and scientific terms used herein have the same meanings as commonly understood by one of ordinary skill in the art to which the present disclosure belongs. The terms "first," "second," etc., which are used in the present disclosure, are not intended to indicate any sequence, amount or importance, but distinguish various components. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

In order to keep the following description of the embodiments of the present disclosure clear and concise, the present disclosure omits detailed descriptions of some known functions and components.

Normally, in the design of a pixel circuit, an initial signal line adopts a layout method of horizontal layout into each pixel circuit, and is connected to an active semiconductor layer through a hole to connect with a first electrode of a reset transistor to provide an initial signal: a data signal adopts a layout method of vertical layout into each pixel circuit, and is given to the active semiconductor layer through a hole to connect with a first electrode of a data writing transistor, the data writing transistor is turned on in conjunction with a scan driving signal, thereby writing a data signal to a storage capacitor: a scan signal line, a light-emitting control signal line, and a reset signal line are usually connected to a pixel in a horizontal connection mode to drive the pixel circuit to operate in the horizontal direction. In the design of the pixel circuit, the storage capacitor is easily affected by the leakage current of the initial signal and affects the normal operation of the pixel circuit, the design occupies a large layout space, the capacitive resistance load for signal transmission is large, which is not conducive to the stable operation of the pixel circuit, and greatly limits the application range of the product.

At least some embodiments of the present disclosure provide a display substrate and a display panel, the display substrate comprises: a base substrate: and a display region, on the base substrate and comprising a plurality of sub-pixels arranged in an array. Each of the plurality of sub-pixels comprises a light-emitting element and a pixel circuit that drives the light-emitting element to emit light, and the pixel circuit comprises a driving sub-circuit, a data writing sub-circuit, a threshold compensation sub-circuit, and a reset sub-circuit: the driving sub-circuit comprises a control terminal, a first terminal, and a second terminal, and is configured to control a driving current flowing through the light-emitting element, the data writing sub-circuit is connected to the first terminal of the driving sub-circuit, a data line, and a scan signal line, and is configured to write a data signal provided by the data line to the first terminal of the driving sub-circuit in response to a gate scan signal provided by the scan signal line: the threshold compensation sub-circuit is connected to the control terminal and the second terminal of the driving sub-circuit, a first voltage line, and a first reset control signal terminal, and is configured to compensate the driving sub-circuit in response to a first reset control signal received by the first reset control signal terminal and the data signal written: the reset sub-circuit is connected to the second terminal of the driving sub-circuit, a first light-emitting control signal line, an initial signal line, and a second reset control signal terminal, and is configured to apply an initial voltage provided by the initial signal line to the second terminal of the driving sub-circuit in response to a first light-emitting control signal provided by the first light-emitting control signal line and a second reset control signal received by the second reset control signal terminal: the reset sub-circuit comprises a first reset transistor and a second reset transistor, the threshold compensation sub-circuit comprises a threshold compensation transistor and a storage capacitor, an orthographic projection of the second reset transistor on the base substrate is between an orthographic projection of the first reset transistor on the base substrate and an orthographic projection of the threshold compensation transistor on the base substrate, and an orthographic projection of the storage capacitor on the base substrate is between the orthographic projection of the second reset transistor on the base substrate and the orthographic projection of the threshold compensation transistor on the base substrate.

In the display substrate provided by the embodiments of the present disclosure, by defining the positions of the first reset transistor, the second reset transistor, and the threshold compensation transistor, the initial signal passes through the first reset transistor, the second reset transistor, and the threshold compensation transistor to reach the control terminal of the driving sub-circuit, thereby extending the leakage path of the initial signal line and reducing the influence of the leakage of the initial signal on the storage capacitor. In addition, the display substrate has a simple structure, is easy to design and manufacture, and has a low cost.

Several embodiments of the present disclosure will be described in detail below with reference to the accompanying drawings, but the present disclosure is not limited to these specific embodiments.

Figure 2A:
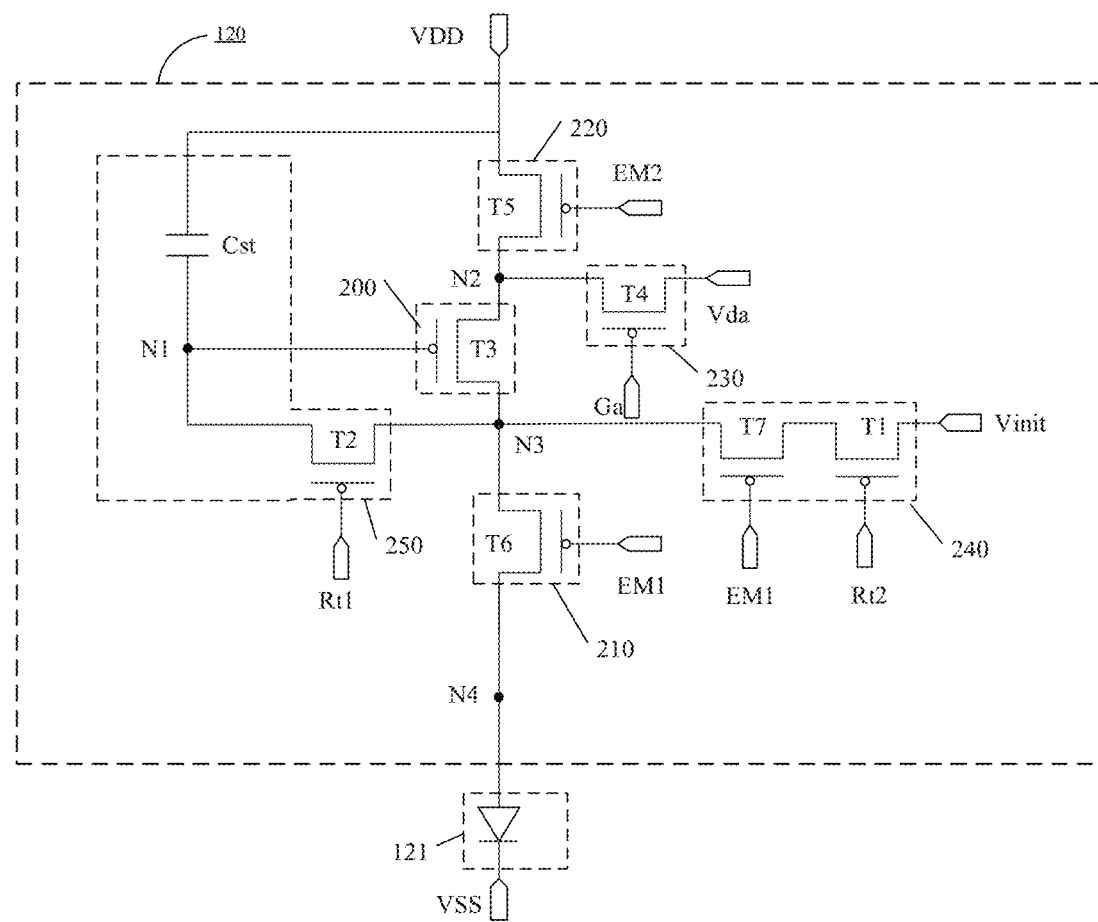
FIG. 2A is a structural schematic diagram of a pixel circuit provided by some embodiments of the present disclosure.
Figure 2B:
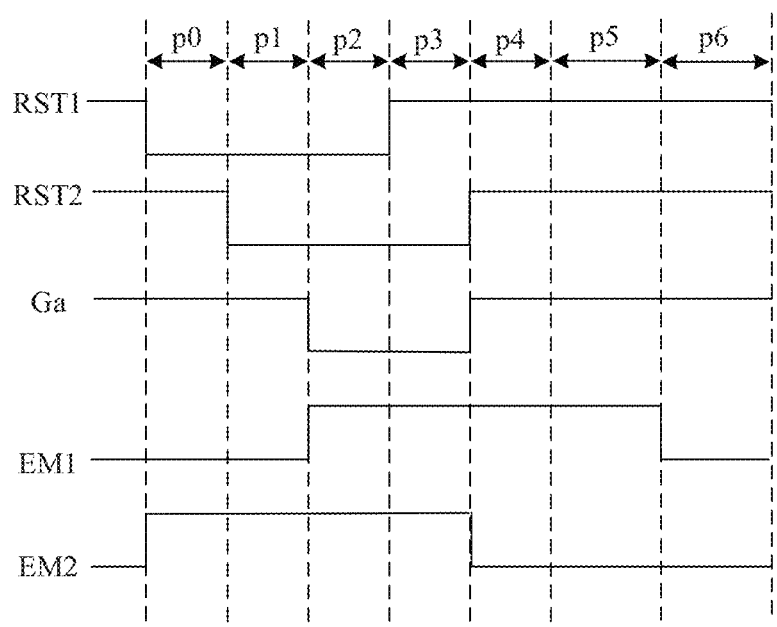
FIG. 2B is a circuit timing diagram of a pixel circuit provided by some embodiments of the present disclosure.

FIG. 1 is a schematic block diagram of a display substrate provided by some embodiments of the present disclosure, FIG. 2A is a structural schematic diagram of a pixel circuit provided by some embodiments of the present disclosure, and FIG. 2B is a circuit timing diagram of a pixel circuit provided by some embodiments of the present disclosure.

For example, as shown in FIG. 1, the display substrate 100 provided by the embodiment of the present disclosure includes a base substrate 10 and a plurality of sub-pixels 12, a first voltage line, a data line, a scan signal line, and a light-emitting control signal line, and a second light-emitting control signal line, which are arranged on the base substrate 10. It should be noted that FIG. 1 does not show the first voltage line, the data line, the scan signal line, the first light-emitting control signal line, and the second light-emitting control signal line.

For example, the display substrate 100 may be applied to a display panel, such as an active matrix organic light-emitting diode (AMOLED) display panel, etc. The display substrate 100 may be an array substrate.

For example, the base substrate 10 may be a flexible substrate or a rigid substrate. For example, the base substrate 10 can be made of, for example, glass, plastic, quartz, or other suitable materials, and the embodiments of the present disclosure are not limited to this case.

For example, each sub-pixel 12 includes a light-emitting element 121 and a pixel circuit 120, and the light-emitting element 121 is located on a side of the pixel circuit 120 away from the base substrate 10.

For example, the pixel circuit 120 is configured to drive the light-emitting element 121 to emit light. The pixel circuit and its working principle will be described below in conjunction with FIG. 2A and FIG. 2B.

For example, as shown in FIG. 2A, the pixel circuit 120 includes a driving sub-circuit 200, a first light-emitting control sub-circuit 210, a second light-emitting control sub-circuit 220, a data writing sub-circuit 230, a threshold compensation sub-circuit 250, and a reset sub-circuit 240.

For example, as shown in FIG. 2A, the driving sub-circuit 200 includes a control terminal, a first terminal, and a second terminal, and is configured to control a driving current flowing through the light-emitting element 121. For example, the control terminal of the driving sub-circuit 200 is connected to a first node N1, the first terminal of the driving sub-circuit 200 is connected to a second node N2, and the second terminal of the driving sub-circuit 200 is connected to a third node N3.

The data writing sub-circuit 230 is connected to the first terminal of the driving sub-circuit 200, a data line Vda, and a scan signal line Ga, and is configured to write a data signal provided by the data line Vda to the first terminal of the driving sub-circuit 200 in response to a gate scan signal provided by the scan signal line Ga.

The threshold compensation sub-circuit 250 is connected to the control terminal and the second terminal of the driving sub-circuit 200, a first voltage line VDD, and a first reset control signal terminal Rt1, and is configured to compensate the driving sub-circuit 200 in response to a first reset control signal received by the first reset control signal terminal Rt1 and the data signal written.

The reset sub-circuit 240 is connected to the second terminal of the driving sub-circuit 200, a first light-emitting control signal line EM1, an initial signal line Vinit, and a second reset control signal terminal Rt2, and is configured to apply an initial voltage provided by the initial signal line Vinit to the second terminal of the driving sub-circuit 200 in response to a first light-emitting control signal provided by the first light-emitting control signal line EM1 and a second reset control signal received by the second reset control signal terminal Rt2.

The first light-emitting control sub-circuit 210 is connected to the second terminal of the driving sub-circuit 200, a first terminal of the light-emitting element 121, and the first light-emitting control signal line EM1, and is configured such that the driving current is applied to the light-emitting element 121 in response to a first light-emitting control signal provided by the first light-emitting control signal line EM1.

The second light-emitting control sub-circuit 220 is connected to the first voltage line VDD, the first terminal of the driving sub-circuit 200, and a second light-emitting control signal line EM2, and is configured to apply a first voltage provided by the first voltage line VDD to the first terminal of the driving sub-circuit 200 in response to a second light-emitting control signal provided by the second light-emitting control signal line EM2.

For example, as shown in FIG. 2A, a second electrode of the light-emitting element 121 is electrically connected to a second voltage line VSS to receive a second voltage.

For example, the light-emitting element 121 may be a light-emitting diode or the like. The light-emitting diode may be a micro light-emitting diode (Micro LED), an organic light-emitting diode (OLED), or a quantum dot light-emitting diode (QLED), etc. The light-emitting element 121 is configured to receive a light-emitting signal (for example, the light-emitting signal may be a driving current) during operation, and to emit light of an intensity corresponding to the light-emitting signal. The light-emitting element 121 may include a first electrode, a second electrode, and a light-emitting layer disposed between the first electrode and the second electrode. The first electrode of the light-emitting element 121 may be an anode, and the second electrode of the light-emitting diode may be a cathode. It should be noted that in the embodiments of the present disclosure, the light-emitting layer of the light-emitting element may include an electroluminescent layer itself and other common layers, such as a hole injection layer, a hole transport layer, an electron injection layer, an electron transport layer, and so on, located on both sides of the electroluminescent layer. Generally, the light-emitting element 121 has a light-emitting threshold voltage, and emits light when the voltage between the first electrode and the second electrode of the light-emitting element 121 is greater than or equal to the light-emitting threshold voltage. In actual applications, the specific structure of the light-emitting element 121 can be designed and determined according to the actual application environment, and the present disclosure is not limited to this case.

For example, when the reset sub-circuit 240 transmits the initial voltage output by the initial signal line Vinit to the control terminal of the driving sub-circuit 200 to initialize the control terminal of the driving sub-circuit 200, the threshold compensation sub-circuit 250 is configured to be turned on under control of the first reset control signal, and at the same time, the first light-emitting control sub-circuit 210 is turned on under control of the first light-emitting control signal, and therefore, the initial voltage is transmitted to the control terminal (i.e., the first node N1) of the driving sub-circuit 2002 via the reset sub-circuit 240 and the threshold compensation sub-circuit 250 to initialize the control terminal of the driving sub-circuit 200, and is transmitted to the first electrode of the light-emitting element 121 via the reset sub-circuit 240 and the first light-emitting control sub-circuit 210 to initialize the first electrode of the light-emitting element 121. That is, under the control of the first light-emitting control signal, the first reset control signal, and the second reset control signal, the initial voltage is transmitted to the control terminal of the driving sub-circuit 200 via the reset sub-circuit 240, and the initial voltage is transmitted to the first electrode of the light-emitting element 121 via the reset sub-circuit 240, the threshold compensation sub-circuit 250, and the first light-emitting control sub-circuit 210, so that the control terminal of the driving sub-circuit 200 and the first electrode of the light-emitting element 121 can be initialized at the same time.

For example, as shown in FIG. 2A, the driving sub-circuit 200 includes a driving transistor T3, the control terminal of the driving sub-circuit 200 includes a gate electrode of the driving transistor T3, the first terminal of the driving sub-circuit 20 includes a first electrode of the driving transistor T3, and the second terminal of the driving sub-circuit 20 includes a second electrode of the driving transistor T3. The gate electrode of the driving transistor T3 is electrically connected to the first node N1, the first electrode of the driving transistor T3 is electrically connected to the second node N2, and the second electrode of the driving transistor T3 is electrically connected to the third node N3.

The first light-emitting control sub-circuit 210 includes a first light-emitting control transistor T6, a gate electrode of the first light-emitting control transistor T6 is electrically connected to the first light-emitting control signal line EM1 to receive the first light-emitting control signal, a first electrode of the first light-emitting control transistor T6 is electrically connected to the third node N3, that is, to the second electrode of the driving transistor T3, and a second electrode of the first light-emitting control transistor T6 is electrically connected to the fourth node N4, that is, is electrically connected to the first electrode of the light-emitting element 121.

The second light-emitting control sub-circuit 220 includes a second light-emitting control transistor T5, a gate electrode of the second light-emitting control transistor T5 is electrically connected to the second light-emitting control signal line EM2 to receive the second light-emitting control signal, a first electrode of the second light-emitting control transistor T5 is electrically connected to the second node N2, that is, is electrically connected to the second electrode of the driving transistor T3, and a second electrode of the second light-emitting control transistor T5 is electrically connected to the first voltage line VDD to receive the first voltage.

The data writing sub-circuit 230 includes a data writing transistor T4, a gate electrode of the data writing transistor T4 is electrically connected to the scan signal line Ga, a first electrode of the data writing transistor T4 is electrically connected to the data line Vda, and a second electrode of the data writing transistor T4 is electrically connected to the second node N2, that is, electrically connected to the first electrode of the driving transistor T3.

The reset sub-circuit 240 includes a first reset transistor T1 and a second reset transistor T7, a gate electrode of the first reset transistor T1 is electrically connected to the second reset signal terminal Rt2, a first electrode of the first reset transistor T1 is electrically connected to an initial signal line Vinit, and a second electrode of the first reset transistor T1 is electrically connected to a first electrode of the second reset transistor T7: a gate electrode of the second reset transistor T7 is electrically connected to a first light-emitting control signal line EM1 to receive a first light-emitting control signal, and a second electrode of the second reset transistor T7 is electrically connected to the third node N1, that is, electrically connected to the second electrode of the driving transistor T3.

The threshold compensation sub-circuit 250 includes a threshold compensation transistor T2 and a storage capacitor Cst, a gate electrode of the threshold compensation transistor T2 is electrically connected to the first reset signal terminal Rt1, a first electrode of the threshold compensation transistor T2 is electrically connected to the third node N3, that is, electrically connected to the second electrode of the driving transistor T3, and a second electrode of the threshold compensation transistor T2 is electrically connected to the first node N1, that is, electrically connected to the gate electrode of the driving transistor T3.

For example, a first electrode plate CC1 of the storage capacitor Cst is electrically connected to the control terminal of the driving sub-circuit 200, and a second electrode plate CC2 of the storage capacitor Cst is electrically connected to the first voltage line VDD to receive the first voltage.

For example, in some embodiments, the first reset transistor T1 and the threshold compensation transistor T2 are both dual-gate transistors, so that the leakage currents of the first reset transistor T1 and the threshold compensation transistor T2 that are electrically connected to the gate electrode of the driving transistor T3 can be relatively small.

For example, one of the voltage output by the first voltage line VDD and the voltage output by the second voltage line VSS is a high voltage, and the other is a low voltage. For example, in the embodiment shown in FIG. 2A, the voltage output by the first voltage line VDD is a constant first voltage, and the first voltage is a positive voltage: the voltage output by the second voltage line VSS is a constant second voltage, and the second voltage is a negative voltage. For example, in some examples, the second voltage line VSS may be grounded.

For example, according to the characteristics of transistors, transistors can be classified into N-type transistors and P-type transistors. For the sake of clarity, the embodiments of the present disclosure describe the technical solutions of the present disclosure in detail by taking a case that the transistor is a P-type transistor (for example, a P-type MOS transistor) as an example. That is, in the description of the present disclosure, the driving transistor T3, the data writing transistor T4, the threshold compensation transistor T2, the first light-emitting control transistor T6, the second light-emitting control transistor T5, the first reset transistor T1, and the second reset transistor T7, etc. can all be P-type transistors, so that the fabrication process can be reduced. However, the transistors in the embodiments of the present disclosure are not limited to P-type transistors, and those skilled in the art can also use N-type transistors (e.g., N-type MOS transistors) to implement the functions of one or more transistors in the embodiments of the present disclosure according to actual application environment, and the present disclosure is not limited thereto.

It should be noted that, transistors used in the embodiments of the present disclosure may be thin film transistors, field effect transistors, or other switching devices with the same characteristics, the thin film transistors may include an oxide semiconductor thin film transistor, an amorphous silicon thin film transistor, a polysilicon thin film transistor, or the like. A source electrode and a drain electrode of a transistor may be symmetrical in structure, so the source electrode and the drain electrode of the transistor may have no difference in physical structure. In the embodiments of the present disclosure, in order to distinguish two electrodes of the transistor in addition to a gate electrode as a control electrode, one of the two electrodes is directly referred to as a first electrode, and the other of the two electrodes is referred to as a second electrode, and therefore, the first electrode and the second electrode of all or part of the transistors in the embodiments of the present disclosure are interchangeable as required.

For example, during specific implementation, in the embodiment of the present disclosure, the initial voltage $V_i$ output by the initial signal line Vinit and the voltage $V_s$ output by the second voltage line VSS may satisfy the following formula: $V_i - V_s < VEL$. VEL represents a light-emitting threshold voltage of the light-emitting element 121.

For example, a first reset terminal Rt1 of a pixel circuit in a y-th row (y is an integer greater than 1) and a second reset terminal Rt2 of a pixel circuit in a (y−1)-th row are connected to a first reset signal line (not shown in the figure): a first reset terminal Rt1 of a pixel circuit in a (y+1)-th row and a second reset terminal Rt2 of a pixel circuit in the y-th row are connected to a second reset signal line (not shown in the figure). That is, sub-pixels in each row are respectively connected with two reset signal lines (a first reset signal line and a second reset signal line) to be connected to the first reset signal terminal Rt1 and the second reset signal terminal Rt2, respectively. For example, a reset signal line (for example, the first reset signal line) is electrically connected to the gate electrode (i.e., the first reset signal terminal Rt1) of the threshold compensation transistor T2 of the sub-pixel in a current row to provide the first reset control signal, the first reset signal line is also connected to the gate electrode (i.e., the second reset signal terminal Rt2) of the first reset transistor T1 of the sub-pixel in an upper row to provide the second reset control signal for the sub-pixel in the upper row: the other reset signal line (for example, the second reset signal line) is electrically connected to the gate electrode (i.e., the first reset signal terminal Rt1) of the threshold compensation transistor T2 corresponding to the pixel circuit in a next row (that is, according to the scan sequence of the scan signal lines, the row of pixel circuits where the scan line is sequentially turned on after the scan signal line in the current row is turned on) to provide a first reset control signal for the sub-pixel in the next row, the second reset signal line is also electrically connected to the gate electrode (i.e., the second reset signal terminal Rt2) of the first reset transistor T1 of the pixel circuit in the current row. That is, every two adjacent rows of sub-pixels share one reset signal line.

The working process of the pixel circuit shown in FIG. 2A will be described below with reference to FIG. 2B.

For example, as shown in FIG. 2B, RST1 represents the first reset control signal provided by the first reset signal line, RST2 represents the second reset control signal provided by the second reset signal line, Ga represents the scan signal output by the scan signal line Ga, EM1 represents the first light-emitting control signal output by the first light-emitting control signal line, and EM2 represents the second light-emitting control signal output by the second light-emitting control signal line. It should be noted that, in the embodiments of the present disclosure, the reference numerals RST1, RST2, Ga, EM1, EM2, Vda, and VDD represent both signal lines and signals on the signal lines.

For example, the working process of a pixel circuit in one display frame may include: a pre-initialization phase p0, an initialization phase p1, a data writing phase p2, a first buffer phase p3, a second buffer phase p4, a third buffer phase P5, and a light-emitting phase p6.

In the pre-initialization phase p0, the first reset control signal RST1 and the first light-emitting control signal EM1 are at a low level, the second reset control signal RST2, the second light-emitting control signal EM2, and the scan signal Ga are at a high level, and therefore, the threshold compensation transistor T2 is turned on under control of the low level of the first reset control signal RST1, and the second reset transistor T7 and the first light-emitting control transistor T6 are also turned on under control of the low level of the first light-emitting control signal EM1, because the first reset transistor T1 is turned off under control of the second reset control signal RST2, in this phase, the initial voltage Vi output by the initial signal line Vinit cannot achieve to initialize the gate electrode of the driving transistor T3 and the first electrode of the light-emitting element 121. The second light-emitting control transistor T5 is turned off under control of the high level of the second light-emitting control signal EM2, and the data writing transistor T4 is turned off under control of the high level of the scan signal Ga.

In the initialization phase p1, the first reset control signal RST1, the second reset control signal RST2, and the first light-emitting control signal EM1 are at a low level, and the second light-emitting control signal EM2 and the scan signal Ga are at a high level, so that the threshold compensation transistor T2 is turned on under control of the low level of the first reset control signal RST1, the first reset transistor T1 is turned on under the control of the low level of the second reset control signal RST2, and the second reset transistor T7 is also turned on under the control of the low level of the first light-emitting control signal EM1, in this way, the initial voltage Vi output by the initial signal line Vinit can be provided to the gate electrode, that is, the first node N1, of the driving transistor T3 through the turned-on threshold compensation transistor T2, the turned-on first reset transistor T1, and the turned-on second reset transistor T7, and therefore, the voltage of the gate electrode of the driving transistor T3 is the initial voltage Vi, thus achieving to initialize the gate electrode of the driving transistor T3. At the same time, the first light-emitting control transistor T6 is also turned on under the control of the low level of the first light-emitting control signal EM1, so that the initial voltage Vi output by the initial signal line Vinit may be provided to the first electrode of the light-emitting element 121 through the turned-on first reset transistor T1, the turned-on second reset transistor T7, and the turned-on first light-emitting control transistor T6 to initialize the first electrode of the light-emitting element 121. The second light-emitting control transistor T5 is turned off under the control of the high level of the second light-emitting control signal EM2, and the data writing transistor T4 is turned off under the control of the high level of the scan signal Ga.

In this phase, the threshold compensation transistor T2 of the pixel circuit in the next row adjacent to the pixel circuit is turned on under the control of the low level of the reset control signal (as the first reset control signal of the pixel circuit in the next row) provided by the second reset signal line RST2.

In the data writing phase p2, the first reset control signal RST1, the second reset control signal RST2, and the scan signal Ga are at a low level, the first light-emitting control signal EM1 and the second light-emitting control signal EM2 are at a high level, thus, the data writing transistor T4 is turned on under the control of the low level of the scan signal Ga, so as to provide the data voltage Vda on the data line Vda to the first electrode of the driving transistor T3, that is, the second node N2, so that the voltage of the first electrode of the driving transistor T3 is the data voltage Vda. The threshold compensation transistor T2 is turned on under the control of the low level of the first reset control signal RST1, which can make the driving transistor T3 be diode-connected, so that the voltage Vda of the second electrode of the driving transistor T3 charges the gate electrode of the driving transistor T3 until the voltage of the gate electrode of the driving transistor T3 becomes Vda+Vth, and the voltage Vda+Vth of the gate electrode of the driving transistor T3 is stored by the storage capacitor Cst. The second reset transistor T7 and the first light-emitting control transistor T6 are turned off under the control of the high level of the first light-emitting control signal EM1, and the second light-emitting control transistor T5 is turned off under the control of the high level of the second light-emitting control signal EM2.

In the first buffer phase p3, the second reset control signal RST2 and the scan signal Ga are at a low level, and the first reset control signal RST1, the first light-emitting control signal EM1, and the second light-emitting control signal EM2 are at a high level, thus, the data writing transistor T4 is turned on under the control of the low level of the scan signal Ga to provide the data voltage Vda on the data line Vda to the first electrode of the driving transistor T3, so that the voltage of the second electrode of the driving transistor T3 continues to be the data voltage Vda. The threshold compensation transistor T2 is turned off under the control of the high level of the reset control signal Rt, the second reset transistor T7 and the first light-emitting control transistor T6 are turned off under the control of the high level of the first light-emitting control signal EM1, and the second light-emitting control transistor T5 is turned off under the control of the high level of the second light-emitting control signal EM2.

It should be noted that, by setting the scan signal Ga to be at a low level in the first buffer phase p3, the data writing transistor T4 can be continuously turned on, so as to make the charging more sufficient.

In the second buffer phase p4, the second light-emitting control signal EM2 is at a low level, the first reset control signal RST1, the second reset control signal RST2, the first light-emitting control signal EM1, and the scan signal Ga are at a high level, Thus, the second light-emitting control transistor T5 is turned on under the control of the high level of the second light-emitting control signal EM2, so that the second light-emitting control transistor T5 can provide the first voltage VDD output from the first voltage line VDD to the first electrode of the driving transistor T3, so that the voltage of the first electrode of the driving transistor T3 is the first voltage VDD. In this way, the first electrode of the driving transistor T3 can be precharged through the first voltage line VDD. The first reset transistor T1 and the threshold compensation transistor T2 are turned off under the control of the high level of the first reset control signal RST1 and the high level of the second reset control signal RST2, the second reset transistor T7 and the first light-emitting control transistor T6 are turned off under the control of the high level of the first light-emitting control signal EM1, and the data writing transistor T4 is turned off under the control of the high level of the scan signal Ga.

In the third buffer phase p5, the second light-emitting control signal EM2 is at a low level, the first reset control signal RST1, the second reset control signal RST2, the first light-emitting control signal EM1, and the scan signal Ga are at a high level, and therefore, the second light-emitting control transistor T5 is turned on under the control of the high level of the second light-emitting control signal EM2, so that the second light-emitting control transistor T5 can continue to provide the first voltage VDD output by the first voltage line VDD to the first electrode of the driving transistor T3, so that the voltage of the first electrode of the driving transistor T3 is the first voltage VDD. In this way, the first electrode of the driving transistor T3 can continue to be precharged through the first voltage line VDD. The first reset transistor T1 and the threshold compensation transistor T2 are turned off under the control of the high level of the first reset control signal RST1 and the high level of the second reset control signal RST2, the second reset transistor T7 and the first light-emitting control transistor T6 are turned off under the control of the high level of the first light-emitting control signal EM1, and the data writing transistor T4 is turned off under the control of the high level of the scan signal Ga.

It should be noted that, by making the first light-emitting control signal EM1 be at a high level in the second buffer phase p4 and the third buffer phase P5, the first light-emitting control transistor T6 can be controlled to be turned off, in this way, the voltage of the gate electrode of the driving transistor T3 can be further stabilized, that is, the current generated by the driving transistor T3 can be further stabilized before being supplied to the light-emitting element 121, thereby further improving the light-emitting stability of the light-emitting element 121.

In the light-emitting phase p6, the first light-emitting control signal EM1 and the second light-emitting control signal EM2 are at a low level, the first reset control signal RST1, the second reset control signal RST2, and the scan signal Ga are at a high level, and thus, the second light-emitting control transistor T5 is turned on under the control of the low level of the second light-emitting control signal EM2, so that the second light-emitting control transistor T5 can provide the first voltage VDD output by the first voltage line VDD to the first electrode of the driving transistor T3, so that the voltage of the first electrode of the driving transistor T3 is the first voltage VDD. In this case, the voltage of the first electrode of the driving transistor T3 is the first voltage VDD, based on the holding effect of the storage capacitor Cst, the voltage of the gate electrode of the driving transistor T3 is Vda+Vth, which can make the driving transistor T3 in a saturated state, so that the driving transistor T3 can generate the driving current Ids: Ids=$K^*((Vda+Vth-VDD)-Vth)^2=K^*(Vda-VDD)^2$, K is a structural constant related to process and design. The first light-emitting control transistor T6 is turned on under the control of the low level of the first light-emitting control signal EM1, so that the first light-emitting control transistor T6 can conduct the second electrode of the driving transistor T3 with the first electrode of the light-emitting element 121, so that the driving current Ids flows into the light-emitting element 121 to drive the light-emitting element 121 to emit light. The first reset transistor T1 and the threshold compensation transistor T2 are turned off under the control of the high level of the first reset control signal RST1 and the second reset control signal RST2, and the data writing transistor T4 is turned off under the control of the high level of the scan signal Ga.

Figure 3:
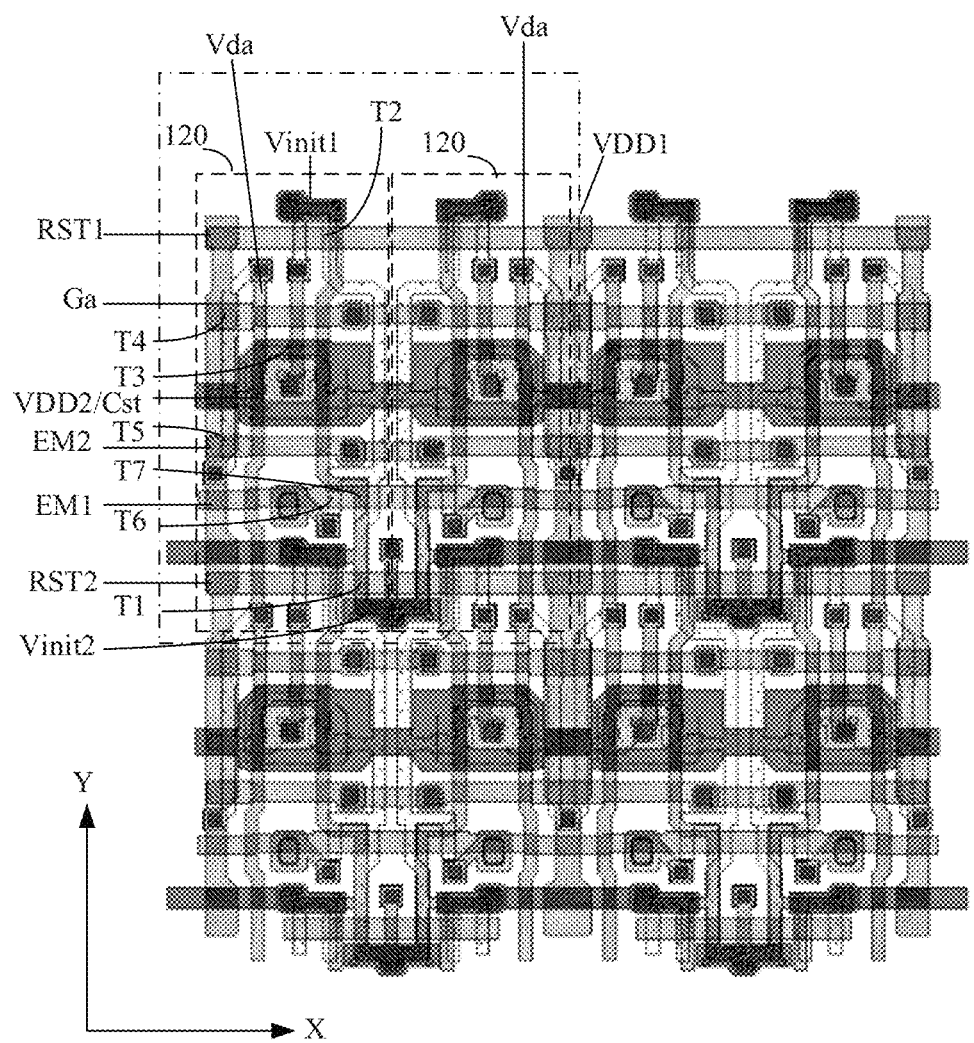
FIG. 3 is a schematic diagram of a layout of a pixel circuit provided by some embodiments of the present disclosure.

FIG. 3 is a schematic diagram of a layout of a pixel circuit provided by some embodiments of the present disclosure, and FIGS. 4A-4M are schematic diagrams of various layers of a pixel circuit provided by some embodiments of the present disclosure. For example, as shown in FIG. 3, a dotted-line box represents one pixel circuit 120, and one pixel circuit 120 is taken as an example for description in the following.

Figure 4A:
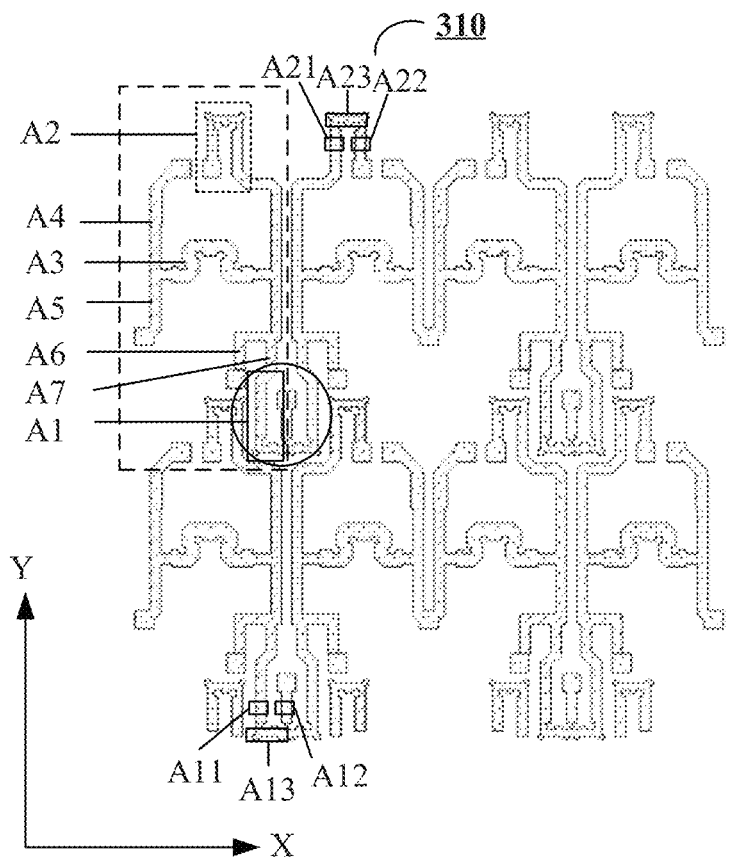
FIGS. 4A-4M are schematic diagrams of various structure layers of a pixel circuit provided by some embodiments of the present disclosure.
Figure 4B:
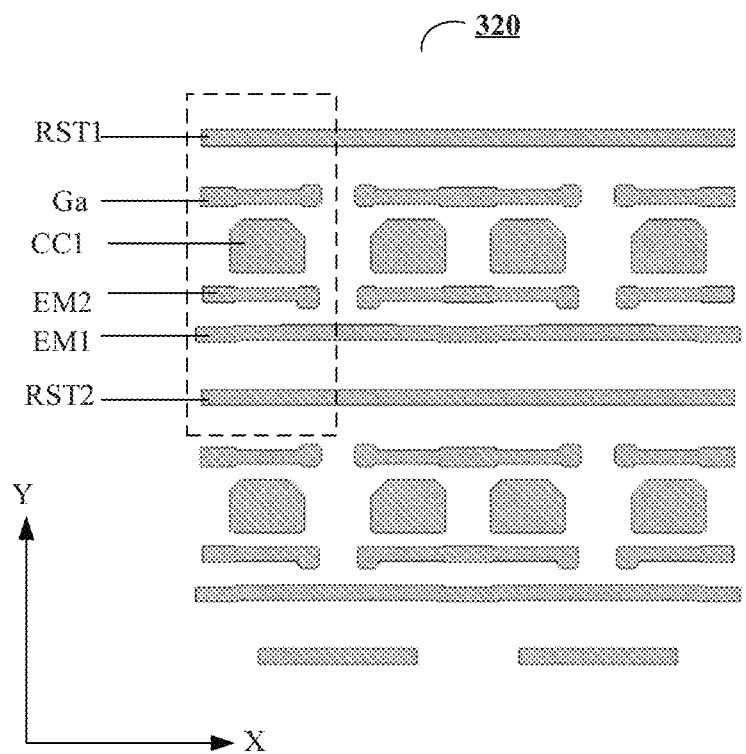
Figure 4C:
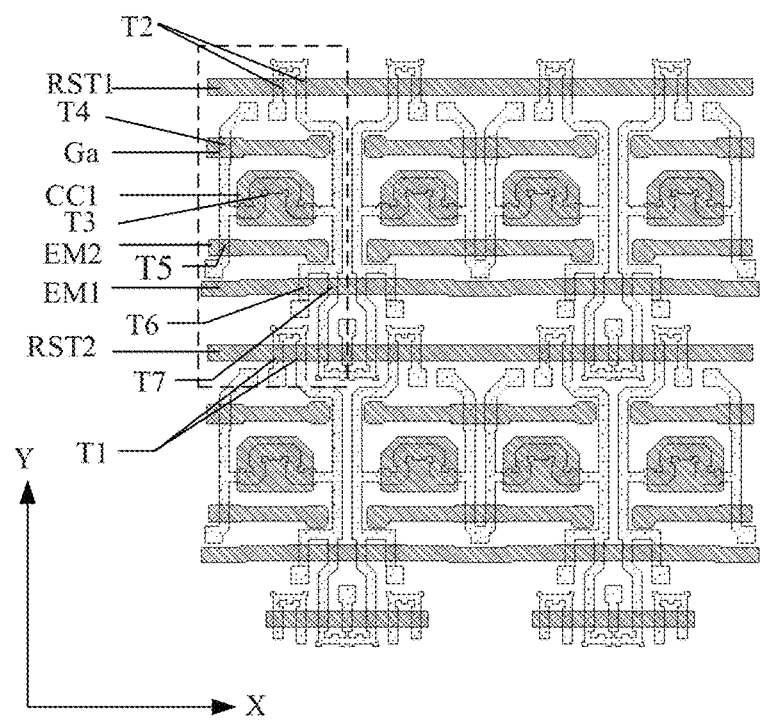
Figure 4D:
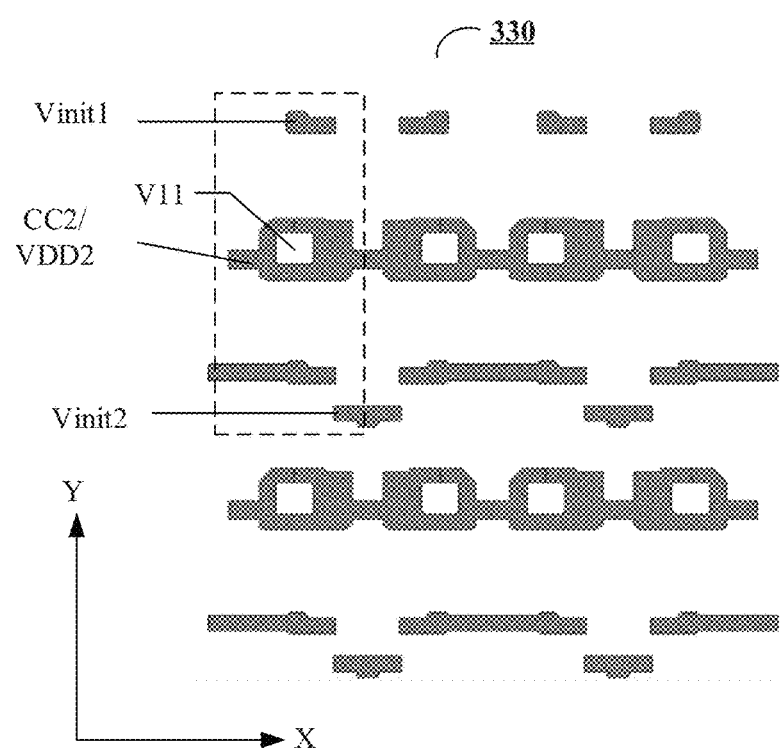

FIG. 3 is a schematic diagram of a layout of the pixel circuit shown in FIG. 2A, the display substrate may include an active semiconductor layer, a first conductive layer, a second conductive layer, a source-drain metal layer, and an anode layer, and each pixel circuit 120 includes an active semiconductor layer 310 (as shown in FIG. 4A), a first conductive layer 320 (as shown in FIG. 4B), a second conductive layer 330 (as shown in FIG. 4C), a source-drain metal layer 340 (as shown in FIG. 4D), and an anode layer. In a direction perpendicular to the base substrate 10, the active semiconductor layer is located between the base substrate 10 and the first conductive layer, the first conductive layer is located between the active semiconductor layer and the second conductive layer, the second conductive layer is located between the first conductive layer and the source-drain metal layer, and the source-drain metal layer is located between the second conductive layer and the anode layer. It should be noted that FIG. 3 only shows the stacking positional relationship among the active semiconductor layer, the first conductive layer, the second conductive layer, and the source-drain metal layer in one pixel circuit.

For example, as shown in FIG. 3, the first light-emitting control signal line EM1, the scan signal line Ga, and the second light-emitting control signal line EM2 extend along the first direction X, and are arranged along the second direction Y which is not parallel to the first direction X.

For example, in some embodiments, the first direction X and the second direction Y are perpendicular to each other. The first direction X may be parallel to the horizontal direction, and the second direction Y may be parallel to the vertical direction.

For example, as shown in FIG. 3, in the second direction, the second reset transistor T7 is located between the threshold compensation transistor T2 and the first reset transistor T1, and the storage capacitor Cst is located between the threshold compensation transistor T2 and the second reset transistor T7. For example, as shown in FIG. 3, an orthographic projection of the second reset transistor T7 on the base substrate 10 is located between an orthographic projection of the first reset transistor T1 on the base substrate 10 and an orthographic projection of the threshold compensation transistor T2 on the base substrate 10, and an orthographic projection of the storage capacitor Cst on the base substrate 10 is located between the orthographic projection of the second reset transistor T7 on the base substrate 10 and the orthographic projection of the threshold compensation transistor T2 on the base substrate 10.

In the embodiments of the present disclosure, by defining the positions of the first reset transistor, the second reset transistor, and the threshold compensation transistor, the initial signal reaches the first node N1 through the first reset transistor, the second reset transistor, and the threshold compensation transistor, so that the leakage path of the initial signal line can be extended, and the influence of the leakage of the initial signal on the storage capacitor can be reduced. In addition, the display substrate has a simple structure, is easy to design and manufacture, and has a low cost.

For example, in the second direction Y, the second light-emitting control signal line EM2 is located between the scan signal line Ga and the first light-emitting control signal line EM1, the storage capacitor Cst is located between the scan signal line Ga and the second light-emitting control signal line EM2, and the second light-emitting control signal line EM2 is located between the storage capacitor Cst and the first light-emitting control signal line EM1. For example, as shown in FIG. 3, an orthographic projection of the first light-emitting control signal line EM1 on the base substrate 10 and an orthographic projection of the second light-emitting control signal line EM2 on the base substrate 10 are located on a side of the orthographic projection of the storage capacitor Cst on the base substrate 10 away from the orthographic projection of the threshold compensation transistor T2 on the base substrate 10, the orthographic projection of the second light-emitting control signal line EM2 on the base substrate 10 is located between the orthographic projection of the first light-emitting control signal line EM1 on the base substrate 10 and the orthographic projection of the storage capacitor Cst on the base substrate 10. That is to say, the first light-emitting control signal line EM1 and the second light-emitting control signal line EM2 are located on the same side of the storage capacitor Cst, for example, the lower side as shown in FIG. 3, the scan signal line Ga is located on the other side of the storage capacitor Cst, for example, the upper side as shown in FIG. 3.

For example, as shown in FIG. 3, the first reset signal line RST1 and the second reset signal line RST2 extend along the first direction X, and in the second direction Y, the first reset signal line RST1 is located on a side of the scan signal line Ga away from the storage capacitor Cst, the second reset signal line RST2 is located on the side of the storage capacitor Cst away from the scan signal line Ga, that is, in the second direction, the orthographic projection of the storage capacitor Cst on the base substrate 10 is located between the orthographic projection of the first reset signal line RST1 on the base substrate 10 and the orthographic projection of the second reset signal line RST2 on the base substrate 10.

For example, as shown in FIG. 3, in the second direction Y, from top to bottom, the first reset signal line RST1, the scan signal line Ga, the first light-emitting control signal line EM1, the second light-emitting control signal line EM2, and the second reset signal line RST2 are arranged in sequence.

For example, various portions of the first conductive layer overlapping the active semiconductor layer are shown in FIG. 3. The first reset signal line RST1, the second reset signal line RST2, the first light-emitting control signal line EM1, the scan signal line Ga, and the second light-emitting control signal line EM2 are all located in the first conductive layer. The active semiconductor layer comprises active layers A1-A7 of the transistors T1-T7, respectively, for example, the first reset signal line RST1 overlaps the active semiconductor layer to define an active layer A2 of the threshold compensation transistor T2, the first light-emitting control signal line EM1 overlaps with the active semiconductor layer to define an active layer A6 of the first light-emitting control transistor T6 and an active layer A7 of the second reset transistor T7, the scan signal line Ga overlaps with the active semiconductor layer to define an active layer A4 of the data writing transistor T4, the second light-emitting control signal line EM2 overlaps the active semiconductor layer to define an active layer A5 of the second light-emitting control transistor T5, the first electrode plate (not shown) of the storage capacitor Cst overlaps with the active semiconductor layer to define an active layer A3 of the driving transistor T3, the second reset signal line RST2 overlaps with the active semiconductor layer to define an active layer A1 of the first reset transistor T1 and an active layer A2 of the threshold compensation transistor T2 in the pixel circuit of the next row.

For example, as shown in FIGS. 3 and 4A, the active layer A2 of the threshold compensation transistor T2, the active layer A6 of the first light-emitting control transistor T6, and the active layer A7 of the second reset transistor T7 are integrally formed. For example, as shown in FIG. 3, the gate electrode of the first light-emitting control transistor T6 and the gate electrode of the second reset transistor T7 are parallel in the first direction. For example, as shown in FIG. 3, the gate electrode of the first light-emitting control transistor T6 and the gate electrode of the second reset transistor T7 are integrally formed with the second light-emitting control signal line EM2.

Figure 4E:
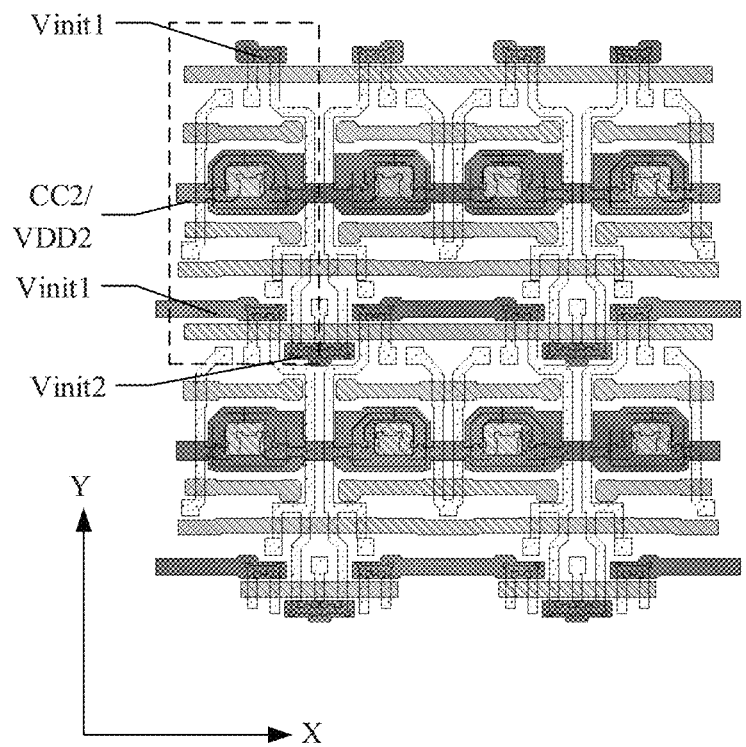
Figure 4F:
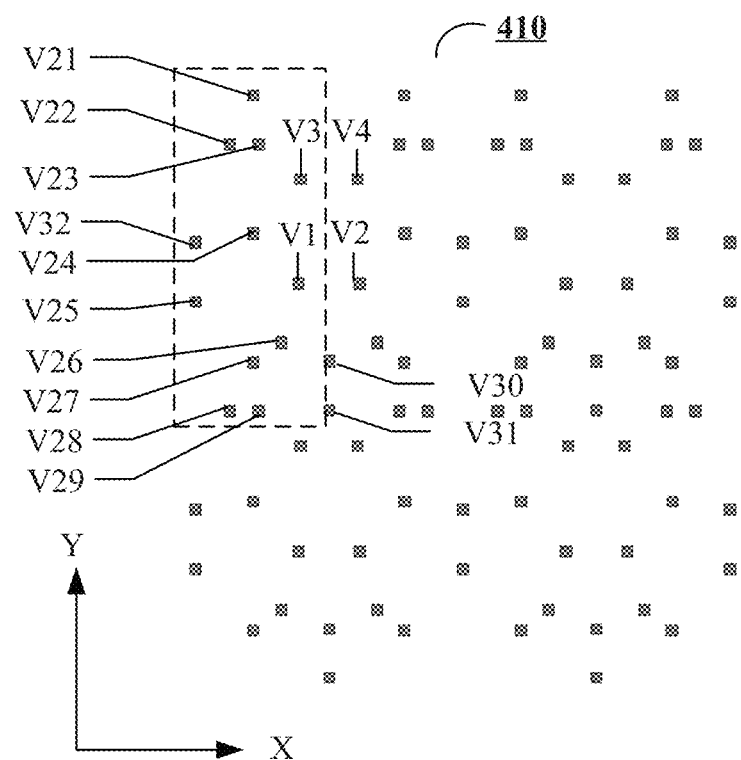
Figure 4G:
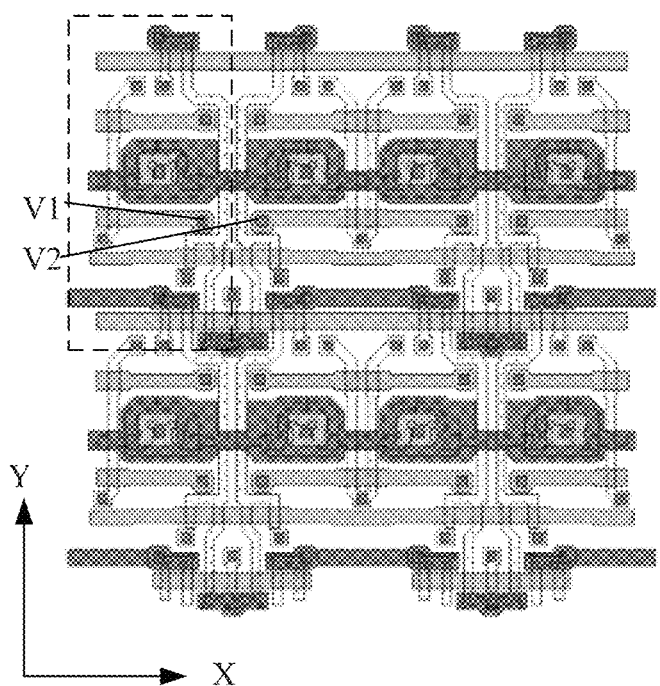
Figure 4H:
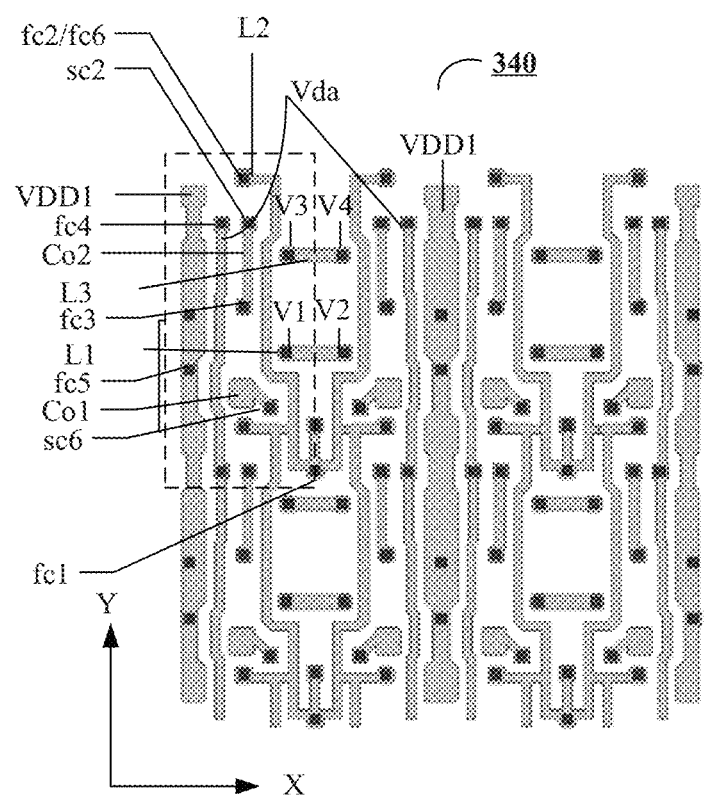
Figure 4I:
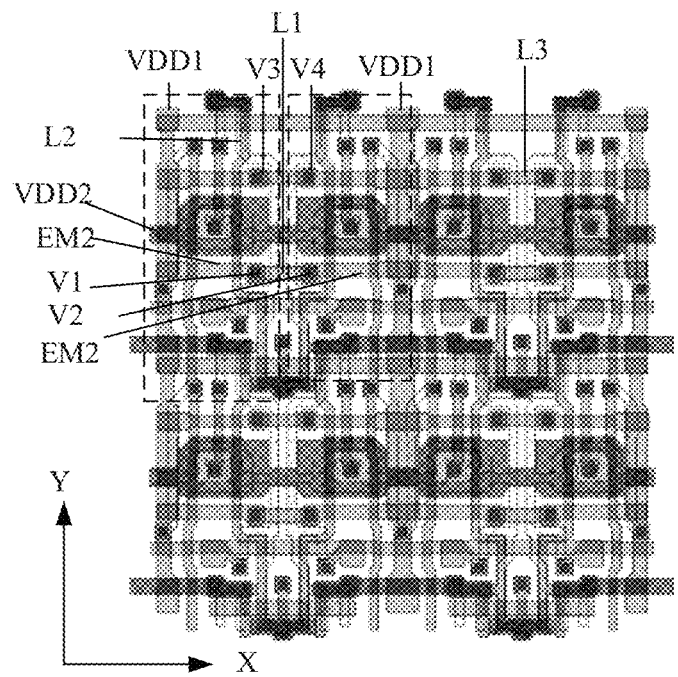

For example, as shown in FIG. 3 and FIGS. 4H and 4I, the display substrate further includes a first connection line L1 extending along the first direction X. For example, the first connection line L1 is located in the source-drain metal layer 340, and is connected to the second light-emitting control signal lines EM2 corresponding to the adjacent sub-pixels respectively through holes V1 and V2 penetrating an insulation layer. For example, the jumper connection of the second light-emitting control signal lines EM2 located in the first conductive layer 320 is achieved through the first connection line L1, on one hand, it can greatly reduce the load of the capacitor and the resistor of the gate driving circuit, ensure the sufficient writing of the signal, and improve the application range of the circuit, for example, the circuit can be applied to the driving of the high frequency signal and the low frequency signal: on the other hand, such jumper connection can effectively avoid the problem of static electricity, and can also be better applied to a large-size display panel, which can effectively avoid the problem of static electricity.

For example, as shown in FIG. 3, the plurality of sub-pixels 12 includes a plurality of sub-pixel pairs (for example, the rectangular dot-dash line box shown in FIG. 3), and the plurality of sub-pixel pairs are arranged in an array along the first direction X and the second direction Y, each sub-pixel pair includes adjacent two sub-pixels in the first direction X, and the pixel circuits of the two sub-pixels are mirror-symmetrical along a symmetry axis parallel to the second direction Y.

As shown in FIG. 3 and FIG. 4A, sub-pixels in an x-th column and sub-pixels in an (x+1)-th column are mirror-symmetrical, for example, an active layer A1 (a generally "U"-shaped structure represented by the rectangular solid-line box shown in FIG. 4A) of a first reset transistor T1 of each sub-pixel in the x-th column and an active layer A1 of a first reset transistor T1 of each sub-pixel in the (x+1)-th column are both U-shaped structures, and the U-shaped structures share one side. For example, after sharing one side, the U-shaped structures may form a generally "m"-shaped structure as indicated by the solid-line ellipse in FIG. 4A. For example, the entirety of the active layer of the first reset transistor T1 and the active layer of the threshold compensation transistor T2 roughly forms a "U" shape, that is, both adopt a "U" shape structure. x is an odd number greater than 0, and certainly may be an even number greater than 0, and the embodiments of the present disclosure are not limited to this case.

In the embodiments of the present disclosure, by adopting the mirror structure design, the first reset transistors T1 of two adjacent sub-pixels share the active layer, which greatly saves the layout space.

For example, as shown in FIG. 4A, for the sake of clarity and conciseness, the first reset transistor T1 of the pixel circuit, adjacent to the pixel circuit in the dotted-line box, in the next row is used as an example for description. The first reset transistor T1 comprises a first gate electrode and a second gate electrode, an active layer A1 of the first reset transistor T1 includes a first channel region A11 corresponding to the first gate electrode, a second channel region A12 corresponding to the second gate electrode, and a first intermediate region A13 between the first channel region A11 and the second channel region A12, and the first channel region A11 and the second channel region A12 are connected through the first intermediate region A13.

For example, as shown in FIG. 4A, for the sake of clarity and conciseness, the threshold compensation transistor T2 of the pixel circuit, adjacent to the pixel circuit in the dotted-line box, in the next column is used as an example for description. The threshold compensation transistor T2 comprises a third gate electrode and a fourth gate electrode, the active layer A2 of the threshold compensation transistor T2 comprises a third channel region A21 corresponding to the third gate electrode, a fourth channel region A22 corresponding to the fourth gate electrode, and a second intermediate region A23 between the third channel region A21 and the fourth channel region A22, and the third channel region A21 and the fourth channel region A22 are connected through the second intermediate region A23.

For example, the initial signal line Vinit includes a first initial sub-signal line Vinit1 and a second initial sub-signal line Vinit2, the first initial sub-signal line Vinit1 extends along the first direction X, and the second initial sub-signal line Vinit2 extends along the first direction X. For example, an orthographic projection of the first intermediate region A13 on the base substrate 10 and an orthographic projection of the second initial sub-signal line Vinit2 on the base substrate 10 at least partially overlap. For example, an orthographic projection of the second intermediate region A23 on the base substrate 10 and an orthographic projection of the first initial sub-signal line Vinit1 on the base substrate 10 at least partially overlap.

For example, as shown in FIGS. 4A, 4H, and 4I, the orthographic projection of the active layer A1 of the first reset transistor T1 on the base substrate 10 at least partially overlaps with an orthographic projection of a second connection line L2 on the base substrate, and the orthographic projection of the first initial sub-signal line Vinit1 on the base substrate 10 and the orthographic projection of the second initial sub-signal line Vinit2 on the base substrate 10 at least partially overlap with the orthographic projection of the second connection line L2 on the base substrate 10. For example, in a direction perpendicular to the base substrate 10, at least part of the first initial sub-signal line Vinit1, the first intermediate region A13 of the first reset transistor T1, and the second connection line L2 overlap, and at least part of the second initial sub-signal line Vinit2, the second intermediate region A23 of the threshold compensation transistor T2, and the second connection line L2 overlap.

For example, as shown in FIG. 3 and FIGS. 4F-4I, the display substrate further includes the second connection line L2, which is located in the third conductive layer 340 and extends along the second direction Y. For example, in some examples, the second connection lines L2 corresponding to two mirror-symmetrical columns of pixel circuits are integrally formed.

For example, as shown in FIG. 3 and FIGS. 4F-4I, the second connection line L2 is connected to the first initial sub-signal line Vinit1 and the second initial sub-signal line Vinit2 through holes V3 and V4 penetrating an insulation layer, so that the first initial sub-signal line Vinit1 and the second initial sub-signal line Vinit2 are electrically connected. In the embodiments of the present disclosure, the vertically extending second connection line L2 and the laterally extending first initial sub-signal line Vinit1 and the second initial sub-signal line Vinit2, which are located on a layer different from the layer where the vertically extending second connection line L2 is located, are connected by means of jumper connection, so that the initial signal line Vinit is wired on the base substrate in a grid and has a mesh structure, that is, on the entire display substrate, the first initial sub-signal line Vinit1 and the second initial sub-signal line Vinit2 are arranged in a grid shape, so that the resistance of the initial signal line Vinit is small and the voltage drop (IR drop) of the initial signal line Vinit is low, which makes the distribution of the initial signal line Vinit on the base substrate more uniform, thereby improving the stability of the initial voltage provided by the initial signal line Vinit and ensuring the initialization effect on the gate electrode of the driving transistor T3 and the first electrode of the light-emitting element 121 in the initialization phase p1.

For example, as shown in FIGS. 3, 4D, 4H and 4I, the first voltage line VDD includes a first sub-voltage line VDD1 and a second sub-voltage line VDD2, the first sub-voltage line VDD1 and the second sub-voltage line VDD2 are electrically connected, the first sub-voltage line VDD1 extends along the second direction Y, and the second sub-voltage line VDD2 extends along the first direction X. The first voltage line VDD is wired in a grid on the base substrate, that is, on the entire display substrate, the first sub-voltage line VDD1 and the second sub-voltage line VDD2 are arranged in a grid shape, so that the resistance of the first voltage line VDD is small and the voltage drop of the first voltage line VDD is low, thereby improving the stability of the power voltage provided by the first voltage line VDD.

For example, as shown in FIG. 4D, the second sub-voltage line VDD2 and the second electrode plate CC2 of the storage capacitor Cst are integrally formed.

For example, as shown in FIGS. 3 and 4H, the data line Vda and the first sub-voltage line VDD1 both extend along the second direction Y and are arranged along the first direction X. For example, in the examples shown in FIGS. 3, 4H, and 4I, the orthographic projection of the data line Vda on the base substrate 10 is located on a side of the orthographic projections of the active layer A4 of the data writing transistor T4 and the active layer A5 of the second light-emitting control transistor T5 on the base substrate away from the orthographic projection of the first sub-voltage line VDD1 on the base substrate 10, for example, the data line Vda is close to the active layer A4 of the data writing transistor T4 and the active layer A5 of the second light-emitting control transistor T5, which facilitates the connection between the data line Vda and the data writing transistor T4, avoids winding, and reduces the size of the display panel.

In some examples, for example, as the examples shown in FIGS. 3 and 4H, in the first direction X, the first sub-voltage line VDD1 is located between two adjacent columns of pixel circuits.

For example, as shown in FIGS. 3 and 4I, in some examples, an orthographic projection of the first sub-voltage line VDD1 on the base substrate 10 is between an orthographic projection of sub-pixels in an (x+1)-th column on the base substrate 10 and an orthographic projection of sub-pixels in an (x+2)-th column on the base substrate 10, and at least partially overlaps with orthographic projections of the active layer of the data writing transistor T4 and the active layer of the second light-emitting control transistor T5 on the base substrate 10, thereby facilitating the connection between the first sub-voltage line VDD1 and the second light-emitting control transistor T5, avoiding winding, and reducing the size of the display panel For example, the scan signal line Ga extends along the first direction X, and the orthographic projection of the scan signal line Ga on the base substrate 10 is located on a side of the orthographic projection of the first electrode plate CC1 of the storage capacitor Cst on the base substrate 10 away from the orthographic projection of the second light-emitting control signal line EM2 on the base substrate 10.

For example, as shown in FIGS. 3 and 4A, the active layer A4 of the data writing transistor T4 and the active layer A5 of the second light-emitting control transistor T5 are integrally formed. For example, the gate electrode of the data writing transistor T4 and the gate electrode of the second light-emitting control transistor T5 are parallel in the second direction Y, for example, are arranged side by side in the second direction Y.

For example, the orthographic projection of the gate electrode of the data writing transistor T4 on the base substrate 10 and the orthographic projection of the gate electrode of the second light-emitting control transistor T5 on the base substrate 10 are respectively located on both sides of the orthographic projection of the storage capacitor Cst on the base substrate 10, that is, the fourth transistor T4 and the fifth transistor T5 are located on both sides of the storage capacitor Cst, for example, the fourth transistor T4 is located on the upper side of the storage capacitor Cst, and the fifth transistor T5 is located on the lower side of the storage capacitor Cst. For example, the orthographic projection of the gate electrode of the data writing transistor T4 on the base substrate 10 and the orthographic projection of the gate electrode of the second light-emitting control transistor T5 on the base substrate 10 are both located on the side of the orthographic projection of the first light-emitting control signal line EM1 on the base substrate close to the orthographic projection of the second light-emitting control signal line EM2 on the base substrate. For example, the fourth transistor T4 and the fifth transistor T5 are both located on the upper side of the first light-emitting control signal line EM1.

For example, the gate electrode of the data writing transistor T4 is integrally formed with the scan signal line, and the gate electrode of the second light-emitting control transistor is integrally formed with the second light-emitting control signal line.

For example, as shown in FIGS. 3, 4H and 4I, the display substrate further includes a third connection line L3 located in the third conductive layer 340 and extending along the first direction X. For example, the third connection line L3 is connected to the scan signal lines Ga corresponding to the adjacent sub-pixels through holes V3 and V4 penetrating the insulation layer 410 (e.g., penetrating the second insulation layer and the third insulation layer 410).

For example, as shown in FIGS. 3 and 4H, the orthographic projections of the first connection line L1 and the third connection line L3 on the base substrate are located between the orthographic projection of the second connection line L2 corresponding to the sub-pixels in the x-th column on the base substrate and the orthographic projection of the second connection line L2 corresponding to the sub-pixels in the (x+1)-th column on the base substrate.

The jumper connection of the scan signal line Ga located in the first conductive layer 320 is achieved through the third connection line L3, the jumper connection of the second light-emitting control signal line EM2 located in the first conductive layer 320 is achieved through the first connection line L1, on one hand, it can greatly reduce the load of the capacitor and the resistor of the gate driving circuit, ensure the sufficient writing of the signal, and improve the application range of the gate driving circuit, for example, the gate driving circuit can be applied to the driving of the high frequency signal and the low frequency signal: on the other hand, such jumper connection can effectively avoid the problem of static electricity, and can also be better applied to a large-size display panel, which can effectively avoid the problem of static electricity.

For example, as shown in FIGS. 3 and 4A, the active layer A3 of the driving transistor T3, the active layer A4 of the data writing transistor T4, the active layer A5 of the second light-emitting control transistor T5, the active layer A2 of the threshold compensation transistor T2, the active layer A6 of the first light-emitting control transistor T6, and the active layer A7 of the second reset transistor T7 are integrally formed.

For example, the orthographic projection of the active layer A3 of the driving transistor T3 on the base substrate 10 overlaps with the orthographic projection of the storage capacitor Cst on the base substrate 10.

For example, in some embodiments, the pixel circuits of the plurality of sub-pixels 12 are arranged in an array along the first direction X and the second direction Y. The positional relationship of various elements of the pixel circuit in this embodiment on the backplane is described below with reference to FIGS. 4A-4M. The example shown in FIGS. 4A-4M takes the pixel circuit 120 shown in FIG. 2A as an example. In FIGS. 4A-4M, the part represented by the rectangular dotted-line box is a region corresponding to one pixel circuit 120, and FIGS. 4A-4M show the layout of the region corresponding to eight pixel circuits arranged in two rows and four columns.

For example, as shown in FIGS. 4A-4M, each pixel circuit 120 may include an active semiconductor layer 310, a first insulation layer (not shown), a first conductive layer 320, a second insulation layer (not shown), a second conductive layer 330, a third insulation layer 410, a source-drain metal layer 340, a planarization layer 420, and an anode layer 350. The active semiconductor layer 310, the first insulation layer (not shown), the first conductive layer 320, the second insulation layer (not shown), the second conductive layer 330, the third insulation layer 410, the source-drain metal layer 340, the planarization layer 420, and the anode layer 350 are sequentially disposed on the base substrate. That is to say, in a direction perpendicular to the base substrate, the active semiconductor layer 310 is located between the base substrate and the first conductive layer 320, the first conductive layer 320 is located between the active semiconductor layer 310 and the second conductive layer 330, the second conductive layer 330 is located between the first conductive layer 320 and the source-drain metal layer 340, the planarization layer 420 is located on the side of the source-drain metal layer 340 away from the base substrate, that is, between the source-drain metal layer 340 and the anode layer 350, the anode layer 350 is located on the side of the planarization layer 420 away from the source-drain metal layer 340. The first insulation layer is located between the active semiconductor layer 310 and the first conductive layer 320, the second insulation layer is located between the first conductive layer 320 and the second conductive layer 330, and the third insulation layer 410 is located between the second conductive layer 330 and the source-drain metal layer 340.

For example, the first insulation layer, the second insulation layer, the third insulation layer 410, and the planarization layer 420 are all made of insulating materials, such as inorganic insulating materials such as silicon nitride, silicon oxide, silicon oxynitride, or other suitable materials.

FIG. 4A shows the active semiconductor layers 310 of the plurality of pixel circuits 120, and the active semiconductor layers 310 may be formed on the base substrate by patterning a semiconductor material. The active semiconductor layer 310 can be used to manufacture the active layer A3 of the driving transistor T3, the active layer A1 of the first reset transistor T1, the active layer A2 of the threshold compensation transistor T2, the active layer A4 of the data writing transistor T4, the active layer A5 of the second light-emitting control transistor T5, the active layer A6 of the first light-emitting control transistor T6, and the active layer A7 of the second reset transistor T7, each active layer may include a source region, a drain region, and a channel region between the source region and the drain region. The channel region is used to form a channel of the transistor.

For example, as shown in FIG. 4A, the active layers of the respective transistors T1-T7 are arranged in the same layer, the active layer A2 of the threshold compensation transistor T2, the active layer A6 of the first light-emitting control transistor T6, the active layer A7 of the second reset transistor T7, and the active layer A7 of the first reset transistor T7 are integrally provided, and the active layer A3 of the driving transistor T3, the active layer A4 of the data writing transistor T4, and the active layer A5 of the second light-emitting control transistor T5 are integrally provided.

For example, as shown in FIG. 4A, in the second direction Y, the active layer A2 of the threshold compensation transistor T2 and the active layer A4 of the data writing transistor T4 are both located on a first side, for example, the upper side shown in FIG. 4A, of the active layer of the driving transistor T3: the active layer A1 of the first reset transistor T1, the active layer A6 of the first light-emitting control transistor T6, the active layer A7 of the second reset transistor T7, and the active layer A5 of the second light-emitting control transistor T5 are all located on a second side, for example, the lower side shown in FIG. 4A, of the active layer of the driving transistor T3.

For example, the active semiconductor layer 310 can be made of amorphous silicon, polysilicon, oxide semiconductor materials, or the like. It should be noted that, the above-mentioned source region and drain region may be regions doped with n-type impurities or p-type impurities. In the embodiment of the present disclosure, the doped source region corresponds to a source electrode of the transistor (for example, the first electrode of the transistor), and the doped drain region corresponds to a drain electrode of the transistor (for example, the second electrode of the transistor).

For example, a first insulation layer (not shown) is formed on a side of the above-mentioned active semiconductor layer 310 away from the base substrate to protect the above-mentioned active semiconductor layer 310. FIG. 4B shows the first conductive layer 320 of the pixel circuit 120, the first conductive layer 320 is disposed on a side of the first insulation layer away from the active semiconductor layer 310 so as to be insulated from the active semiconductor layer 310.

For example, the first reset signal line RST1, the second reset signal line RST2, the first light-emitting control signal line EM1, the scan signal line Ga, and the second light-emitting control signal line EM2 are all located in the first conductive layer 320. In addition, the first conductive layer 320 may further include the first electrode plate CC1 of the storage capacitor Cst, the gate electrode of the first reset transistor T1, the gate electrode of the threshold compensation transistor T2, the gate electrode of the data writing transistor T4, the gate electrode of the second light-emitting control transistor T5, the gate electrode of the first light-emitting control transistor T6, the gate electrode of the second reset transistor T7, and the gate electrode of the driving transistor T3.

For example, as shown in FIG. 4B, the first reset signal line RST1, the second reset signal line RST2, the first light-emitting control signal line EM1, the scan signal line Ga, and the second light-emitting control signal line EM2 all generally extend along the first direction X. In the second direction Y, the first reset signal line RST1, the scan signal line Ga, the second light-emitting control signal line EM2, the first light-emitting control signal line EM1, and the second reset signal line RST2 are arranged in sequence. That is, the first light-emitting control signal line EM1 and the second light-emitting control signal line EM2 are located between the second reset signal line RST2 and the scan signal line Ga, and the first electrode plate CC1 of the storage capacitor Cst is located between the scan signal line Ga and the second light-emitting control signal line EM2.

For example, as shown in FIG. 4B, the first reset signal lines RST1, the second reset signal lines RST2, and the first light-emitting control signal lines EM1 corresponding to respective pixel circuits of each row of sub-pixels are respectively continuous straight lines, the respective pixel circuits correspond to different scan signal lines Ga and different second light-emitting control signal lines EM2, respectively, the scan signal lines Ga corresponding to the respective pixel circuits located in the same row and the second light-emitting control signal lines EM2 corresponding to the respective pixel circuits located in the same row are respectively connected through the third connection line L3 and the first connection line L1 located in the third conductive layer 340.

For example, the first reset signal line RST1 is electrically connected to the gate electrode of the threshold compensation transistor T2 for controlling the threshold compensation transistor T2 to be turned on or off: the second reset signal line RST2 is electrically connected to the gate electrode of the first reset transistor T1 for controlling the first reset transistor T1 to be turned on or off: the first light-emitting control signal line EM1 is electrically connected to the gate electrode of the first light-emitting control transistor T6 and the gate electrode of the second reset transistor T7 for controlling the first light-emitting control transistor T6 and the second reset transistor T7 to be turned on or off: the scan signal line Ga is electrically connected to the gate electrode of the data writing transistor T4 for controlling the data writing transistor T4 to be turned on or off: and the second light-emitting control signal line EM2 is electrically connected to the gate electrode of the second light-emitting control transistor T5 for controlling the second light-emitting control transistor T5 to be turned on or off.

For example, in a direction perpendicular to the base substrate 10, the first reset signal line RST1 at least partially overlaps with the active layer A2 of the threshold compensation transistor T2: the second reset signal line RST2 at least partially overlaps with the active layer A1 of the first reset transistor T1: the first light-emitting control signal line EM1 at least partially overlaps with the active layer A6 of the first light-emitting control transistor T6 and the active layer A7 of the second reset transistor T7: the scan signal line Ga at least partially overlaps with the active layer A4 of the data writing transistor T4: the second light-emitting control signal line EM2 at least partially overlaps with the active layer A5 of the second light-emitting control transistor T5.

As shown in FIG. 4B, the first reset signal line RST1 and the gate electrode of the threshold compensation transistor T2 are integrally provided, and a portion of the first reset signal line RST1 overlapping with the active semiconductor layer 310 is the gate electrode of the threshold compensation transistor T2: the second reset signal line RST2 and the gate electrode of the first reset transistor T1 are integrally provided, and a portion of the second reset signal line RST2 overlapping with the active semiconductor layer 310 is the gate electrode of the first reset transistor T1: the first light-emitting control signal line EM1, the gate electrode of the first light-emitting control transistor T6, and the gate electrode of the second reset transistor T7 are integrally provided, and portions of the first light-emitting control signal line EM1 overlapping with the active semiconductor layer 310 are the gate electrode of the first light-emitting control transistor T6 and the gate electrode of the second reset transistor T7: the scan signal line Ga and the gate electrode of the data writing transistor T4 are integrally provided, and a portion of the scan signal line Ga overlapping with the active semiconductor layer 310 is the gate electrode of the data writing transistor T4; and the second light-emitting control signal line EM2 and the gate electrode of the second light-emitting control transistor T5 are integrally provided, and a portion of the second light-emitting control signal line EM2 overlapping with the active semiconductor layer 310 is the gate electrode of the second light-emitting control transistor T5. The gate electrode of the driving transistor T3 may be the first electrode plate CC1 of the storage capacitor Cst.

For example, as shown in FIG. 4B, the first electrode plate CC1 of the storage capacitor Cst is located between the second light-emitting control signal line EM2 and the scan signal line Ga.

FIG. 4C is a schematic diagram of the stacking positional relationship between the active semiconductor layer 310 and the first conductive layer 320.

For example, as shown in FIG. 4C, in the direction perpendicular to the base substrate 10, the portion of the active semiconductor layer 310 covered by the first electrode plate CC1 of the storage capacitor Cst in the first conductive layer 320 is the active layer A3 of the driving transistor T3, and the shape of the active layer A3 of the driving transistor T3 is the shape of the Chinese character "儿".

For example, the active layer of the first reset transistor T1 is a reset active layer A1, that is, the first reset transistor T1 includes the reset active layer A1, and the reset active layer A1 includes the first channel region A11, the second channel region A12, and the first intermediate region A13 (as shown in FIG. 4A). For example, as shown in FIG. 4C, the orthographic projections of the first channel region A11 and the second channel region A12 on the base substrate at least partially overlap with the orthographic projection of the second reset signal line RST2 on the base substrate.

For example, as shown in FIGS. 4A and 4C, the first reset transistor T1 is a U-shaped double-gate transistor. For example, the active layer A1 of the first reset transistor T1 of each sub-pixel in the x-th column and the active layer A1 of the first reset transistor T1 of each sub-pixel in the (x+1)-th column share one side of the U-shaped structure, for example, after sharing one side, may form a generally "m"-shaped structure as indicated by the solid-line ellipse in FIG. 4A.

For example, the active layer of the threshold compensation transistor T2 is a compensation active layer A2, that is, the threshold compensation transistor T2 includes the compensation active layer A2, and the compensation active layer A2 includes the third channel A21, the fourth channel A22, and the second intermediate region A23. For example, as shown in FIG. 4C, the orthographic projections of the third channel A21 and the fourth channel A22 on the base substrate 10 at least partially overlap with the orthographic projection of the first reset signal line RST1 on the base substrate.

For example, the threshold compensation transistor T2 is a U-shaped double-gate transistor.

For example, as shown in FIGS. 4A and 4C, the first channel region A11 and the second channel region A12 are arranged in sequence in the first direction X: the third channel A21 and the fourth channel A22 are arranged in sequence in the first direction X.

For example, the shape of the reset active layer A1 and the shape of the compensation active layer A2 are approximately the same.

For example, the first reset transistor T1 includes two gate electrodes, and the threshold compensation transistor T2 includes two gate electrodes. As shown in FIG. 4C, in the direction perpendicular to the base substrate 10, the first reset signal line RST1 and the active semiconductor layer 310 overlap each other to form two overlapping portions, and the two overlapping portions are the two gate electrodes of the threshold compensation transistor T2; the second reset signal line RST2 and the active semiconductor layer 310 overlap each other to form two overlapping portions, and the two overlapping portions are the two gate electrodes of the first reset transistor T1.

For example, as shown in FIG. 4A, in the second direction Y, the length of the first channel region A11 and the length of the second channel region A12 are approximately equal: the length of the third channel A21 and the length of the fourth channel A22 are approximately equal.

For example, the shape of the first channel region A11, the shape of the second channel region A12, the shape of the third channel A21, and the shape of the fourth channel A22 are all rectangular.

For example, as shown in FIG. 4C, in the direction perpendicular to the base substrate 10, portions of the active semiconductor layer 310 covered by the first light-emitting control signal line EM1 in the first conductive layer 320 are the active layer of the first light-emitting control transistor T6 and the active layer of the second reset transistor T7, and the shape of the active layer of the first light-emitting control transistor T6 and the shape of the active layer of the second reset transistor T7 are both rectangular.

For example, as shown in FIG. 4C, in the direction perpendicular to the base substrate, the portion of the active semiconductor layer 310 covered by the scan signal line Ga in the first conductive layer 320 is the active layer of the data writing transistor T4, and the shape of the active layer of the data writing transistor T4 is a rectangle.

For example, as shown in FIG. 4C, in the direction perpendicular to the base substrate, the portion of the active semiconductor layer 310 covered by the second light-emitting control signal line EM2 in the first conductive layer 320 is the active layer of the second light-emitting control transistor T5, and the shape of the active layer of the second light-emitting control transistor T5 is a rectangle.

For example, as shown in FIG. 4C, in the second direction Y, the gate electrode of the threshold compensation transistor T2 and the gate electrode of the data writing transistor T4 are both located on the first side, for example, the upper side as shown in FIG. 4C, of the gate electrode of the driving transistor T3: the gate electrode of the first reset transistor T1, the gate electrode of the first light-emitting control transistor T6, the gate electrode of the second reset transistor T7, and the gate electrode of the second light-emitting control transistor T5 are located on the second side, for example, the lower side as shown in FIG. 4C, of the gate electrode of the driving transistor T3.

FIG. 4E is a schematic diagram of the stacking positional relationship of the active semiconductor layer 310, the first conductive layer 320, and the second conductive layer 330.

For example, a second insulation layer (not shown) is formed on a side of the above-mentioned first conductive layer 320 away from the first insulation layer, so as to protect the above-mentioned first conductive layer 320. FIG. 4D shows the second conductive layer 330 of the pixel circuit 120, the second conductive layer 330 is formed on the side of the second insulation layer away from the first conductive layer 320, the second conductive layer 330 includes the second electrode plate CC2 of the storage capacitor Cst, the first initial sub-signal line Vinit1 and the second sub-voltage line VDD2. As shown in FIG. 4E, the first initial sub-signal line Vinit1, the second sub-voltage line VDD2, and the second initial sub-signal line Vinit2 all extend along the first direction X and are arranged along the second direction Y, in the direction perpendicular to the base substrate, the first electrode plate CC1 of the storage capacitor Cst and the second electrode plate CC2 of the storage capacitor Cst at least partially overlap to form the storage capacitor Cst. For example, the second sub-voltage line VDD2 is integrally formed with the second electrode plate CC2 of the storage capacitor Cst.

For example, as shown in FIG. 4D and FIG. 4E, the second electrode plate CC2 of the storage capacitor Cst includes a conductive layer hole V11, the second electrode of the threshold compensation transistor T2 and the second electrode of the second reset transistor T7 are electrically connected to the first electrode plate CC1 of the storage capacitor Cst (i.e., the gate electrode of the driving transistor DT) through the conductive layer hole V11.

For example, as shown in FIG. 4D and FIG. 4E, the initial signal line Vinit includes the first initial sub-signal line Vinit1 and the second initial sub-signal line Vinit2, the orthographic projection of the second intermediate region T23 of the active layer of the threshold compensation transistor T2 on the base substrate 10 is located within the orthographic projection of the first initial sub-signal line Vinit1 on the base substrate, and the orthographic projection of the first intermediate region T13 of the active layer of the first reset transistor T1 on the base substrate is located within the orthographic projection of the second initial sub-signal line Vinit2 on the base substrate.

In the embodiments of the present disclosure, the portion (i.e., the second intermediate region A23) of the active layer of the threshold compensation transistor T2 that is not shielded by the first reset signal line RST1 is shielded by the first initial sub-signal line Vinit1, the portion (i.e., the first intermediate region A13) of the active layer of the first reset transistor T1 that is not shielded by the second reset signal line RST2 is shielded by the second initial sub-signal line Vinit2, so that there is no need to separately provide a shielding layer to shield them, so that the first reset transistor T1 and the threshold compensation transistor T2 can be made more stable, and at the same time, the wiring on the display substrate can be reduced, and the cost can be reduced.

FIG. 4G is a schematic diagram of the stacking positional relationship of the active semiconductor layer 310, the first conductive layer 320, the second conductive layer 330, and the third insulation layer 410.

For example, as shown in FIG. 4F, a third insulation layer 410 is formed on the side of the above-mentioned second conductive layer 330 away from the second insulation layer to protect the above-mentioned second conductive layer 330. A plurality of insulation layer holes V1, V2, V11-V31 are formed in the third insulation layer 410. The plurality of insulation layer holes V1, V2, V21-V31 correspond to one pixel circuit.

For example, as shown in FIG. 4F and FIG. 4G, the insulation layer hole V21 penetrates the third insulation layer 410 to expose a portion of the first initial sub-signal line Vinit1; the insulation layer holes V22-23, the insulation layer holes V25-27, and the insulation layer holes V30-31 penetrate the first insulation layer, the second insulation layer, and the third insulation layer 410 to expose portions of the active semiconductor layer 310; and the insulation layer hole V24 penetrates the second insulation layer and the third insulation layer 410 to expose a portion of the first electrode plate CC1 of the storage capacitor Cst. For example, the orthographic projection of the insulation layer hole V24 on the base substrate is located within the orthographic projection of the conductive layer hole V11 on the base substrate.

FIG. 4H shows the source-drain metal layer 340 of the pixel circuit 120, and the source-drain metal layer 340 is disposed on a side of the third insulation layer 410 away from the second conductive layer 330. FIG. 4I is a schematic diagram illustrating the stacking positional relationship of the active semiconductor layer 310, the first conductive layer 320, the second conductive layer 330, the third insulation layer 410, and the source-drain metal layer 340.

For example, as shown in FIG. 4H, the source-drain metal layer 340 includes the data line Vda, the first sub-voltage line VDD1, the second initial sub-signal line Vinit2, the first electrode fc1 of the first reset transistor T1, the first electrode fc2 and the second electrode sc2 of the threshold compensation transistor T2, the first electrode fc3 of the driving transistor T3, the first electrode fc4 of the data writing transistor T4, the second electrode sc5 of the second light-emitting control transistor T5, the first electrode fc6 of the first light-emitting control transistor T6, the first connection electrode Co1, and the second connection electrode Co2.

For example, as shown in FIGS. 4F, 4H, and 4I, the first electrode fc1 of the first reset transistor T1 is connected to the second initial sub-signal line Vinit2, for example, the first electrode fc1 of the first reset transistor T1 is a portion of the second initial sub-signal line Vinit2. The first electrode fc1 of the first reset transistor T1 is connected to a source region or a drain region, corresponding to the first reset transistor T1, in the active semiconductor layer 310 through an insulation layer hole V31.

For example, as shown in FIGS. 4F, 4H, and 4I, the first electrode fc2 of the threshold compensation transistor T2 and the first electrode fc6 of the first light-emitting control transistor T6 are the same electrode, and are connected to a source region or a drain region, corresponding to the threshold compensation transistor T2 and the first light-emitting control transistor T6, in the active semiconductor layer 310 through the insulation layer hole V21. The second electrode sc2 of the threshold compensation transistor T2 is connected to a source region or a drain region, corresponding to the threshold compensation transistor T2, in the active semiconductor layer 310 through the insulation layer hole V23.

For example, the second electrode sc6 of the first light-emitting control transistor T6 is connected to the first connection electrode Co1, for example, the second electrode sc6 of the first light-emitting control transistor T6 is a portion of the first connection electrode Co1. For example, the second electrode sc6 of the first light-emitting control transistor T6 is connected to a source region or a drain region, corresponding to the first light-emitting control transistor T6, in the active semiconductor layer 310 through the insulation layer hole V26.

For example, the second electrode sc2 of the threshold compensation transistor T2 is a portion of the second connection electrode Co2.

For example, as shown in FIGS. 4F, 4H, and 4I, the first electrode fc4 of the data writing transistor T4 is connected to the data line Vda, for example, the first electrode fc4 of the data writing transistor T4 is a portion of the data line Vda, the first electrode fc4 of the data writing transistor T4 is connected to a source region or a drain region, corresponding to the data writing transistor T4, in the active semiconductor layer 310 through the insulation layer hole V22.

For example, as shown in FIGS. 4F, 4H, and 4I, the first electrode fc5 of the second light-emitting control transistor T5 is connected to the first sub-voltage line VDD1, for example, the first electrode fc5 of the second light-emitting control transistor T5 is a portion of the first sub-voltage line VDD1. The first electrode fc5 of the second light-emitting control transistor T5 is connected to a source region or a drain region, corresponding to the second light-emitting control transistor T5, in the active semiconductor layer 310 through the insulation layer hole V25.

For example, as shown in FIGS. 4F, 4H, and 4I, the second electrode sc7 of the second reset transistor T7 is connected to the source region or the drain region, corresponding to the second reset transistor T7, in the active semiconductor layer 310 through the insulation layer hole h26. The second electrode sc7 of the second reset transistor T7 is connected to the second connection electrode Co2, for example, the second electrode sc7 of the second reset transistor T7 is a portion of the second connection electrode Co2.

For example, as shown in FIGS. 4F, 4H, and 4I, the first electrode fc3 of the driving transistor T3 is connected to the source region or the drain region, corresponding to the driving transistor T3, in the active semiconductor layer 310 through the insulation layer hole V24.

For example, as shown in FIG. 4F and FIG. 4H, the second connection electrode Co2 is connected to the first electrode plate CC1 of the storage capacitor Cst, that is, the gate electrode of the driving transistor T3, through the insulation layer hole V24.

For example, as shown in FIGS. 4F and 4H, the second initial sub-signal line Vinit2 is electrically connected to the second connection line L2 through the insulation layer hole V29.

For example, the second electrode of the data writing transistor T4, the first electrode of the second light-emitting control transistor T5, and the first electrode of the driving transistor T3 are integrally provided.

For example, as shown in FIG. 4D and FIG. 4H, the first sub-voltage line VDD1 and the second sub-voltage line VDD2 are located in different layers, and are located in the source-drain metal layer 340 and the third conductive layer 330, respectively. The first initial sub-signal line Vinit1 and the second initial sub-signal line Vinit2 are located in the same layer, and both are located in the third conductive layer 330. For example, as shown in FIG. 4F, the first sub-voltage line VDD1 and the second sub-voltage line VDD2 located in different layers are connected through the hole V32 penetrating the third insulation layer.

For example, as shown in FIG. 4H, the data line Vda extends substantially along the second direction Y, and the first sub-voltage line VDD1 and the data line Vda are located in the same layer, that is, the source-drain metal layer 340, the first sub-voltage line VDD1 and the data line Vda are arranged along the first direction X, and in the first direction X, the data line Vda is located between two adjacent first sub-voltage lines VDD1.

Figure 4J:
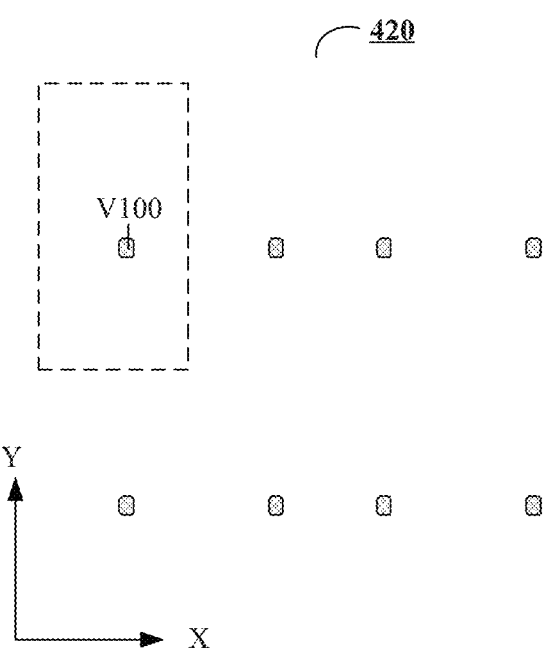

For example, a planarization layer 420 is formed on the side of the above-mentioned source-drain metal layer 340 away from the third insulation layer 410 to protect the above-mentioned source-drain metal layer 340. As shown in FIG. 4J, the planarization layer 420 includes a first hole V100, and the first hole V100 penetrates the planarization layer 420. For example, the second electrode of the first light-emitting control transistor T6 is electrically connected to the first electrode of the light-emitting element 121 through the first hole V100 penetrating the planarization layer 420.

Figure 4K:
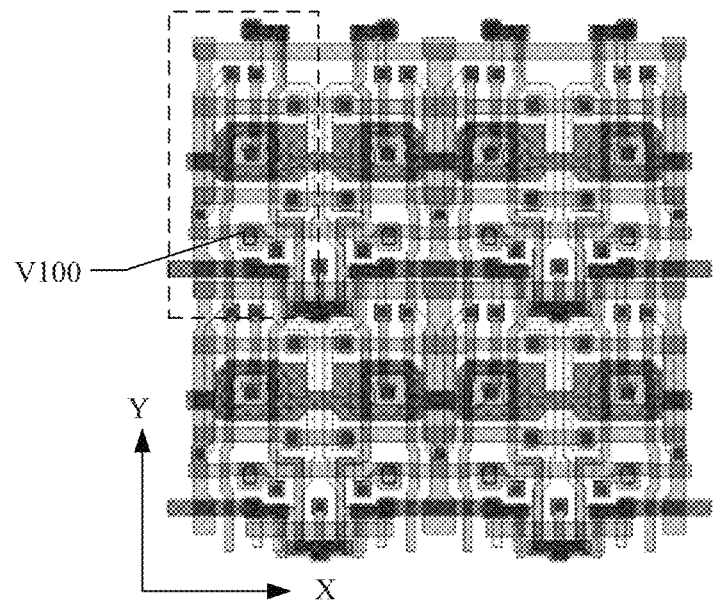

FIG. 4K is a schematic diagram of the stacking positional relationship of the active semiconductor layer 310, the first conductive layer 320, the second conductive layer 330, the third insulation layer 410, the source-drain metal layer 340, and the planarization layer 420.

For example, as shown in FIG. 4K, in the second direction Y, the orthographic projection of the first hole V100 on the base substrate and the orthographic projection of the first light-emitting control signal line EM1 on the base substrate at least partially overlap, of course, the embodiments of the present disclosure are not limited to this, and the position of the first hole V100 can be set flexibly, and can be adapted to pixel circuits with various pixel arrangements. In addition, the position of the first hole V100 can be flexibly adjusted according to the setting position of the first electrode of the light-emitting element, so that the first hole V100 is closer to the first electrode of the light-emitting element, thereby reducing the wiring of the first electrode of the light-emitting element, and the connection between the first electrode of the light-emitting element and the second electrode of the first light-emitting control transistor T6 is more flexible.

Figure 4L:
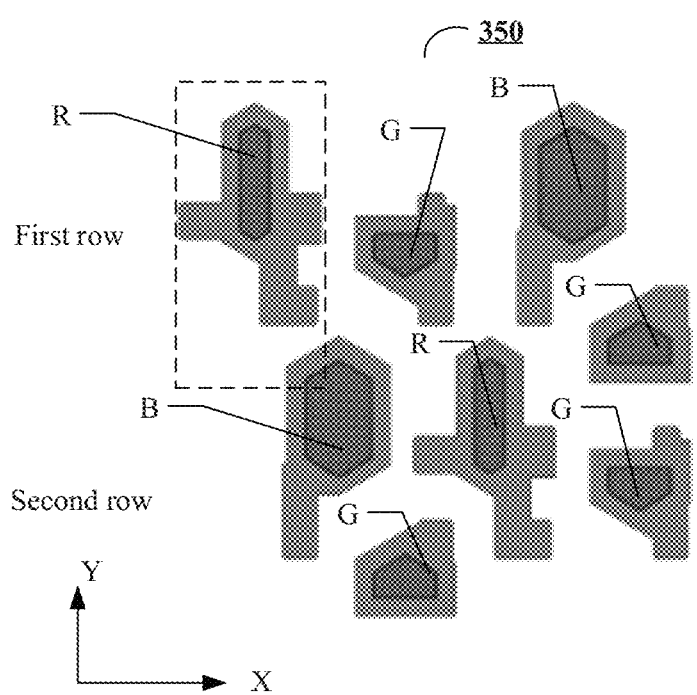

FIG. 4L shows the anode layer 350 of the pixel circuit 120, and the anode layer 350 includes the first electrode (i.e., the anode) R/G/B of the light-emitting element 121. It should be noted that, in FIG. 4L, only the electroluminescent layer in the light-emitting layer is shown, and other common layers are not shown.

For example, in some embodiments, a plurality of sub-pixels in each row are arranged in a manner of RGBGRGBG, and the sub-pixels of two adjacent rows are staggered by two sub-pixels, for example, as shown in FIG. 4L, a plurality of sub-pixels located in an odd-numbered row (a first row) are arranged in the manner of RGBGRGBG, and a plurality of sub-pixels located in an even-numbered row (a second row) are arranged in the manner of BGRGRGBG. It should be noted that the plurality of sub-pixels in the display panel may include red sub-pixels, blue sub-pixels, and green sub-pixels, in FIG. 4L, B represents the first electrode of the light-emitting element in the blue sub-pixel, G represents the first electrode of the light-emitting element in the green sub-pixel, and R represents the first electrode of the light-emitting element in the red sub-pixel. For example, the area of the first electrode of the blue sub-pixel B is larger than the area of the first electrode of the green sub-pixel G, and is larger than the area of the first electrode of the red sub-pixel R.

Figure 4M:
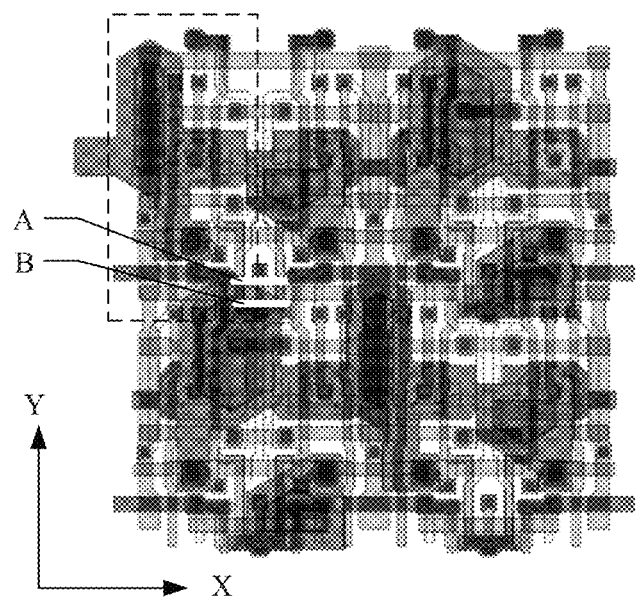

FIG. 4M is a schematic diagram of the stacking positional relationship of the active semiconductor layer 310, the first conductive layer 320, the second conductive layer 330, the third insulation layer 410, the source-drain metal layer 340, the planarization layer 420, and the anode layer 350. For example, as shown in FIG. 4M, the first electrode of the light-emitting element 121 is connected to the first connection electrode Co1 through the first hole V100. The first connection electrode Co1 is connected to the second electrode sc6 of the first light-emitting control transistor T6, so that the first electrode of the light-emitting element 121 is electrically connected to the second electrode sc6 of the first light-emitting control transistor T6.

Figure 5A:
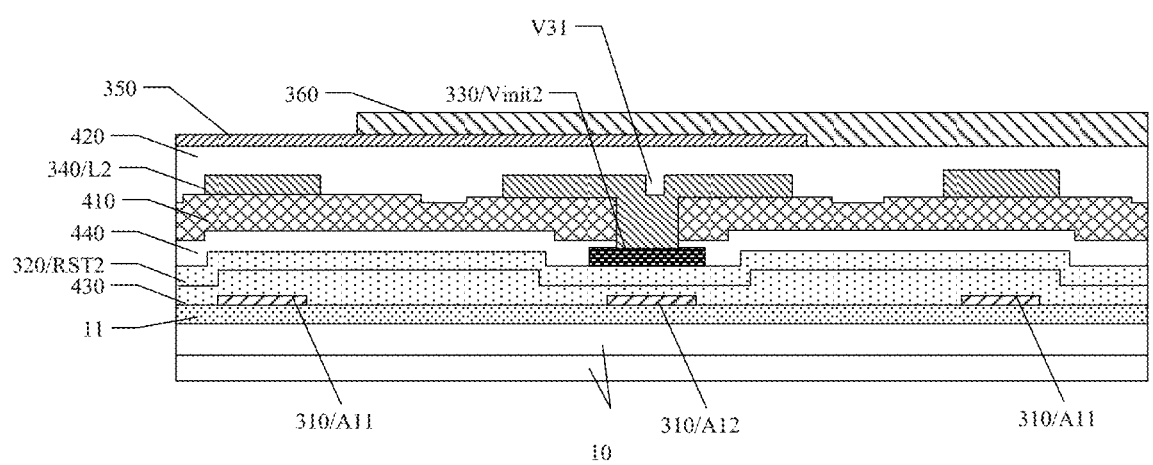
FIG. 5A is a schematic diagram of a cross-sectional structure at a line A in FIG. 4M.
Figure 5B:
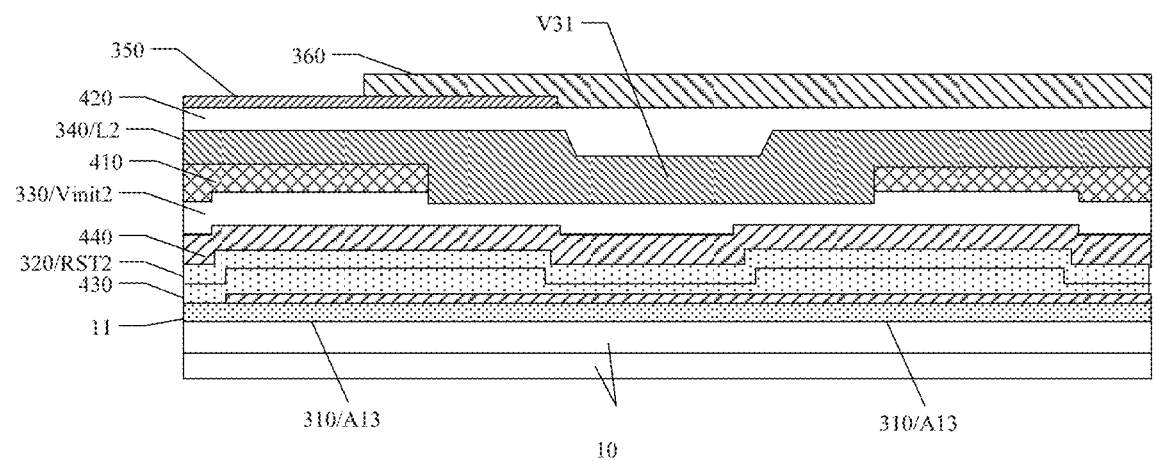
FIG. 5B is a schematic diagram of a cross-sectional structure at a line B in FIG. 4M.

FIG. 5A is a schematic diagram of a cross-sectional structure at a line A in FIG. 4M, and FIG. 5B is a schematic diagram of a cross-sectional structure at a line B in FIG. 4M.

For example, as shown in FIG. 5A and FIG. 5B, the base substrate 10 includes a structure of a plurality of layers (e.g., FIG. 5A shows a structure of two layers), and the plurality of layers in the structure are all made of flexible materials.

For example, as shown in FIG. 5A and FIG. 5B, a buffer layer 11 is formed on the base substrate 10 to prevent external water vapor, oxygen, and impurities from entering the pixel circuit 120. For example, the material of the buffer layer 11 may include inorganic insulating materials such as silicon oxide, silicon nitride, and silicon oxynitride, or other suitable materials. Because the silicon nitride material has a high dielectric constant and a good hydrophobic function, the silicon nitride material can well protect the sub-pixel circuit from being corroded by water vapor.

For example, as shown in FIGS. 5A and 5B, the active semiconductor layer 310 is formed on the side of the buffer layer 11 away from the base substrate 10, the active semiconductor layer 310 shown in FIG. 5A includes the first channel region A11 and the second channel region A12 of the first reset transistor T1 and the first channel region A11 of the first reset transistor T1 of a row of sub-pixels adjacent to the first reset transistor T1, and therefore, the sub-pixels in the x-th column and the sub-pixels in the (x+1)-th column can be mirror-symmetrical, and share one side of the "U"-shaped structure to form a roughly "m"-shaped structure as indicated in the solid-line ellipse in FIG. 4A. The active semiconductor layer 310 shown in FIG. 5B includes the first intermediate region A13 of the two first reset transistors T1 sharing a "U"-shaped structure.

For example, as shown in FIGS. 5A and 5B, the first insulation layer 430 is formed on the side of the active semiconductor layer 310 away from the buffer layer 11, and the first conductive layer 320 is formed on a side of the first insulation layer 430 away from the active semiconductor layer 310, for example, the first conductive layer 320 includes the second reset signal line RST2 and the first gate electrode and the second gate electrode of the first reset transistor T1, the second reset signal line RST2 is integrally formed with the first gate electrode and the second gate electrode of the first reset transistor T1, and the first gate electrode and the second gate electrode of the first reset transistor T1 are portions of the first conductive layer 320 corresponding to the first channel region A11 and the second channel region A12, respectively. The first conductive layer 320 shown in FIG. 5B includes the second reset signal line RST2.

For example, as shown in FIGS. 5A and 5B, the second insulation layer 440 is formed on the side of the first conductive layer 320 away from the first insulation layer 430, and the second conductive layer 330 is formed on the side of the second insulation layer 440 away from the first conductive layer 320. The second conductive layer 330 shown in FIGS. 5A and 5B includes the second initial sub-signal line Vinit2, and the orthographic projection of the first intermediate region A13 of the first reset transistor T1 on the base substrate 10 is located within the orthographic projection of the second initial sub-signal line Vinit2 on the base substrate 10, and therefore, in the direction perpendicular to the base substrate 10, the second initial sub-signal line Vinit2 can shield the first intermediate region A13. In the embodiments of the present disclosure, the portion (the first intermediate region A13) of the active layer of the first reset transistor T1 that is not shielded by the second reset signal line RST2 is shielded by the second initial sub-signal line Vinit2, there is no need to separately provide a shielding layer to shield it, so that the first reset transistor T1 can be made more stable, and at the same time, the wiring on the display substrate can be reduced, and the cost can be reduced.

For example, as shown in FIGS. 5A and 5B, the third insulation layer 410 is formed on the side of the second conductive layer 330 away from the second insulation layer 440, the source-drain metal layer 340 is formed on a side of the third insulation layer 410 away from the second conductive layer 330, and the source-drain metal layer 340 shown in FIG. 5A includes the second connection line L2, the second connection line L2 is connected to the second initial sub-signal line Vinit2 through the insulation layer hole V31 penetrating the third insulation layer 410, so that the first initial sub-signal line Vinit1 and the second initial sub-signal line Vinit2 can be electrically connected to each other, and the mesh connection of the initial signal line Vinit can be achieved. The source-drain metal layer 340 shown in FIG. 5B includes the second connection line L2, and the second connection line L2 is connected to the second initial sub-signal line Vinit2 through the insulation layer hole V31 penetrating the third insulation layer 410.

For example, as shown in FIGS. 5A and 5B, the planarization layer 420 is formed on the side of the source-drain metal layer 340 away from the third insulation layer 410, the anode layer 350 is formed on the side of the planarization layer 420 away from the source-drain metal layer 340, and a pixel defining layer 360 is formed on the side of the anode layer 350 away from the planarization layer 420 and is formed on the planarization layer 420. The pixel defining layer 360 includes a plurality of pixel openings. In the direction perpendicular to the base substrate, each pixel opening exposes at least a portion of the first electrode R/G/B of the corresponding light-emitting element. For example, the area of the pixel opening of one blue sub-pixel is larger than the area of the pixel opening of one green sub-pixel, and is larger than the area of the pixel opening of one red sub-pixel. In some embodiments, the area of the pixel opening of one green sub-pixel may be approximately equal to the area of the pixel opening of one red sub-pixel. In other embodiments, the area of the pixel opening of one green sub-pixel is smaller than the area of the pixel opening of one red sub-pixel.

For example, in some other embodiments, the plurality of sub-pixels 12 includes a plurality of sub-pixel pairs (e.g., the rectangular dot-dash line box shown in FIG. 3), the plurality of sub-pixel pairs are arranged in an array along the first direction X and the second direction Y, each sub-pixel pair includes two sub-pixels that are adjacent in the first direction X, and the pixel circuits of the two sub-pixels are mirror-symmetrical along a symmetry axis parallel to the second direction Y.

It should be noted that, in the present disclosure, the region shown by the rectangular dotted-line box or the rectangular dot-dash line box only represents the approximate region of the pixel circuit or the pixel circuits of the sub-pixel pair, and the actual region of the pixel circuit is related to the specific setting positions of the transistors and capacitors in the pixel circuit.

In the display substrate provided by the embodiments of the present disclosure, by defining the positions of the first reset transistor, the second reset transistor, and the threshold compensation transistor, so that the initial signal reaches the control terminal of the driving circuit through the first reset transistor, the second reset transistor, and the threshold compensation transistor, thereby extending the leakage path of the initial signal line and reducing the influence of the leakage of the initial signal on the storage capacitor. In addition, the display substrate has a simple structure, is easy to design and manufacture, and has a low cost.

Figure 6:
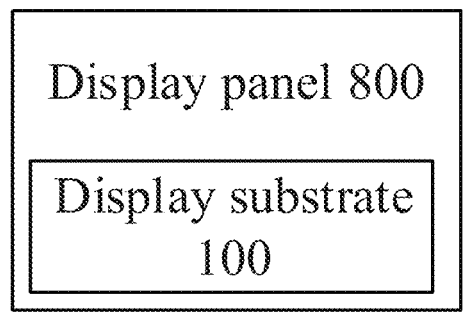
FIG. 6 is a schematic diagram of a display panel provided by at least one embodiment of the present disclosure.

At least one embodiment of the present disclosure further provides a display panel. FIG. 6 is a schematic diagram of a display panel provided by at least one embodiment of the present disclosure. As shown in FIG. 6, the display panel 800 includes the display substrate 100 provided by any embodiment of the present disclosure, for example, the display substrate 100 shown in FIG. 1.

For example, the display panel 800 may be a liquid crystal display panel or an organic light-emitting diode (OLED) display panel or the like. For example, when the display panel 800 is a liquid crystal display panel, the display substrate 100 may be an array substrate or a color film substrate. When the display panel 800 is an organic light-emitting diode display panel, the display substrate 100 may be an array substrate.

For example, the display panel 800 may be a rectangular panel, a circular panel, an oval panel, a polygonal panel, or the like. In addition, the display panel 800 can be not only a flat panel, but also a curved panel, or even a spherical panel.

For example, the display panel 800 may also have a touch function, that is, the display panel 800 may be a touch display panel.

For example, the display panel 800 can be applied to any product or component with a display function, such as a mobile phone, a tablet computer, a television, a monitor, a notebook computer, a digital photo frame, a navigator, and the like.

For example, the display panel 800 may be a flexible display panel, so as to meet various practical application requirements, for example, the display panel 800 may be applied to a curved screen and the like.

It should be noted that the display panel 800 may further include other components, such as a data driving circuit, a timing controller, and the like, and the embodiments of the present disclosure are not limited thereto. For the sake of clarity and conciseness, the embodiments of the present disclosure do not show all the constituent units of the display panel 800. In order to achieve the basic functions of the display panel 800, those skilled in the art can provide or set other structures not shown according to specific needs, and the embodiments of the present disclosure are not limited to this case.

Regarding the technical effect of the display panel 800 provided by the above embodiments, reference may be made to the technical effect of the display substrate 100 provided in the embodiments of the present disclosure, and will not be repeated here.

For this disclosure, the following points should be noted:
(1) Only the structures involved in the embodiments of the present disclosure are illustrated in the drawings of the embodiments of the present disclosure, and other structures can refer to usual designs.
(2) For clarity, in the drawings used to describe the embodiments of the present disclosure, the thickness and size of layers or structures are exaggerated. It can be understood that when an element, such as a layer, film, region or substrate is said to be "above" or "below" another element, the element may be "directly" above or "below" another element, or there may be intervening elements.
(3) The embodiments and features in the embodiments of the present disclosure may be combined in case of no conflict to acquire new embodiments.

What have been described above merely are exemplary embodiments of the present disclosure, and not intended to define the scope of the present disclosure, and the scope of the present disclosure is determined by the appended claims.

What is claimed is:

1. A display substrate, comprising:
a base substrate; and
a display region, on the base substrate and comprising a plurality of sub-pixels arranged in an array,
wherein each of the plurality of sub-pixels comprises a light-emitting element and a pixel circuit that drives the light-emitting element to emit light, and the pixel circuit comprises a driving sub-circuit, a data writing sub-circuit, a threshold compensation sub-circuit, and a reset sub-circuit;
the driving sub-circuit comprises a control terminal, a first terminal, and a second terminal, and is configured to control a driving current flowing through the light-emitting element;
the data writing sub-circuit is connected to the first terminal of the driving sub-circuit, a data line, and a scan signal line, and is configured to write a data signal provided by the data line to the first terminal of the driving sub-circuit in response to a gate scan signal provided by the scan signal line;
the threshold compensation sub-circuit is connected to the control terminal and the second terminal of the driving sub-circuit, a first voltage line, and a first reset control signal terminal, and is configured to compensate the driving sub-circuit in response to a first reset control signal received by the first reset control signal terminal and the data signal written; and
the reset sub-circuit is connected to the second terminal of the driving sub-circuit, a first light-emitting control signal line, an initial signal line, and a second reset control signal terminal, and is configured to apply an initial voltage provided by the initial signal line to the second terminal of the driving sub-circuit in response to a first light-emitting control signal provided by the first light-emitting control signal line and a second reset control signal received by the second reset control signal terminal,
wherein the reset sub-circuit comprises a first reset transistor and a second reset transistor, the threshold compensation sub-circuit comprises a threshold compensation transistor and a storage capacitor, an orthographic projection of the second reset transistor on the base substrate is between an orthographic projection of the first reset transistor on the base substrate and an orthographic projection of the threshold compensation transistor on the base substrate, and an orthographic projection of the storage capacitor on the base substrate is between the orthographic projection of the second reset transistor on the base substrate and the orthographic projection of the threshold compensation transistor on the base substrate;
wherein gate electrodes of the first reset transistor are connected to the second reset control signal terminal to receive the second reset control signal, and a gate electrode of the second reset transistor is connected to the first light-emitting control signal line to receive the first light-emitting control signal.

2. The display substrate according to claim 1, wherein the pixel circuit further comprises a first light-emitting control sub-circuit and a second light-emitting control sub-circuit;
the first light-emitting control sub-circuit is connected to the second terminal of the driving sub-circuit, a first terminal of the light-emitting element, and the first light-emitting control signal line, and is configured to apply the driving current to the light-emitting element in response to the first light-emitting control signal provided by the first light-emitting control signal line; and
the second light-emitting control sub-circuit is connected to the first voltage line, the first terminal of the driving sub-circuit, and the second light-emitting control signal line, and is configured to apply a first voltage provided by the first voltage line to the first terminal of the driving sub-circuit in response to the second light-emitting control signal provided by the second light-emitting control signal line,
wherein the first light-emitting control signal line and the second light-emitting control signal line extend along a first direction, an orthographic projection of the first light-emitting control signal line on the base substrate is between an orthographic projection of the second light-emitting control signal line on the base substrate and the orthographic projection of the storage capacitor on the base substrate.

3. The display substrate according to claim 2, wherein the orthographic projection of the second light-emitting control signal line on the base substrate is between the orthographic projection of the first light-emitting control signal line on the base substrate and the orthographic projection of the storage capacitor on the base substrate.

4. The display substrate according to claim 2, wherein the first light-emitting control sub-circuit comprises a first light-emitting control transistor;
an active layer of the threshold compensation transistor, an active layer of the first light-emitting control transistor, and an active layer of the second reset transistor are integrally formed; and
a gate electrode of the first light-emitting control transistor and the gate electrode of the second reset transistor are parallel in the first direction.

5. The display substrate according to claim 4, wherein the gate electrode of the first light-emitting control transistor and the gate electrode of the second reset transistor are integrally formed with the second light-emitting control signal line.

6. The display substrate according to claim 4, further comprising a first connection line extending along the first direction,
wherein the first connection line is connected to second light-emitting control signal lines respectively corresponding to adjacent sub-pixels through holes penetrating an insulation layer.

7. The display substrate according to claim 1, wherein sub-pixels in an x-th column and sub-pixels in an (x+1)-th column are mirror-symmetrical; and
an active layer of a first reset transistor of each sub-pixel in the x-th column and an active layer of a first reset transistor of each sub-pixel in the (x+1)-th column are both U-shaped structures, and the U-shaped structures share one side,
wherein x is an odd or even number greater than 0.

8. The display substrate according to claim 6, wherein the first reset transistor comprises a first gate electrode and a second gate electrode, an active layer of the first reset transistor comprises a first channel region corresponding to the first gate electrode, a second channel region corresponding to the second gate electrode, and a first intermediate region between the first channel region and the second channel region, and the first channel region and the second channel region are connected through the first intermediate region; and
the threshold compensation transistor comprises a third gate electrode and a fourth gate electrode, the active layer of the threshold compensation transistor comprises a third channel region corresponding to the third gate electrode, a fourth channel region corresponding to the fourth gate electrode, and a second intermediate region between the third channel region and the fourth channel region, and the third channel region and the fourth channel region are connected through the second intermediate region.

9. The display substrate according to claim 8, wherein the initial signal line comprises a first initial sub-signal line and a second initial sub-signal line extending along the first direction;
an orthographic projection of the first intermediate region on the base substrate and an orthographic projection of the second initial sub-signal line on the base substrate at least partially overlap; and
an orthographic projection of the second intermediate region on the base substrate and an orthographic projection of the first initial sub-signal line on the base substrate at least partially overlap.

10. The display substrate according to claim 9, further comprising a second connection line extending along a second direction,
wherein the first direction and the second direction intersect, the second connection line is connected to the first initial sub-signal line and the second initial sub-signal line through holes penetrating an insulation layer.

11. The display substrate according to claim 10, wherein an orthographic projection of the active layer of the first reset transistor on the base substrate and an orthographic projection of the second connection line on the base substrate at least partially overlap, and the orthographic projection of the first initial sub-signal line on the base substrate and the orthographic projection of the second initial sub-signal line on the base substrate at least partially overlap with the orthographic projection of the second connection line on the base substrate.

12. The display substrate according to claim 2, wherein the scan signal line extends along the first direction, and the orthographic projection of the storage capacitor on the base substrate is between an orthographic projection of the scan signal line on the base substrate and the orthographic projection of the second light-emitting control signal line on the base substrate.

13. The display substrate according to claim 10, wherein the data writing sub-circuit comprises a data writing transistor, and the second light-emitting control sub-circuit comprises a second light-emitting control transistor;
an active layer of the data writing transistor and an active layer of the second light-emitting control transistor are integrally formed;
a gate electrode of the data writing transistor and a gate electrode of the second light-emitting control transistor are parallel in the second direction.

14. The display substrate according to claim 13, wherein an orthographic projection of the gate electrode of the data writing transistor on the base substrate and an orthographic projection of the gate electrode of the second light-emitting control transistor on the base substrate are respectively on both sides of the orthographic projection of the storage capacitor on the base substrate, and are on a side of the orthographic projection of the first light-emitting control signal line on the base substrate close to the orthographic projection of the second light-emitting control signal line on the base substrate.

15. The display substrate according to claim 14, wherein the gate electrode of the data writing transistor and the scan signal line are integrally formed, and the gate electrode of the second light-emitting control transistor and the second light-emitting control signal line are integrally formed.

16. The display substrate according to claim 15, further comprising a third connection line extending along the first direction, wherein the third connection line is connected to scan signal lines corresponding to adjacent sub-pixels through holes penetrating an insulation layer.

17. The display substrate according to claim 16, wherein an orthographic projection of the first connection line on the base substrate, an orthographic projection of the third connection line on the base substrate and the orthographic projection of the second initial sub-signal line on the base substrate are arranged side by side in the second direction.

18. The display substrate according to claim 13, wherein the driving sub-circuit comprises a driving transistor, an active layer of the driving transistor, the active layer of the data writing transistor, the active layer of the second light-emitting control transistor, the active layer of the threshold compensation transistor, the active layer of the first light-emitting control transistor, and the active layer of the second reset transistor are integrally formed;
wherein an orthographic projection of the active layer of the driving transistor on the base substrate overlaps the orthographic projection of the storage capacitor on the base substrate.

19. The display substrate according to claim 13, wherein the first voltage line comprises a first sub-voltage line extending in the second direction and a second sub-voltage line extending in the first direction,
an orthographic projection of the first sub-voltage line on the base substrate is between an orthographic projection of sub-pixels in an (x+1)-th column on the base substrate and an orthographic projection of sub-pixels in an (x+2)-th column on the base substrate, and at least partially overlaps with an orthographic projection of the active layer of the data writing transistor on the base substrate and an orthographic projection of the active layer of the second light-emitting control transistor on the base substrate; and
the second sub-voltage line is integrally formed with a second electrode of the storage capacitor,
wherein x is an odd or even number greater than 0;
wherein the data line extends along the second direction,
an orthographic projection of the data line on the base substrate is on a side of the orthographic projections of the active layer of the data writing transistor and the active layer of the second light-emitting control transistor on the base substrate away from the orthographic projection of the first sub-voltage line on the base substrate.

20. The display substrate according to claim 1, wherein first reset terminals of pixel circuits in a y-th row and second reset terminals of pixel circuits in a (y−1)-th row are connected to a first reset signal line; and
first reset terminals of pixel circuits in a (y+1)-th row and second reset terminals of the pixel circuits in the y-th row are connected to a second reset signal line,
wherein the first reset signal line is formed integrally with gate electrodes of the threshold compensation transistors of the pixel circuits in the y-th row and the gate electrodes of the first reset transistor of the pixel circuits in the (y−1)-th row;
the second reset signal line is formed integrally with gate electrodes of the threshold compensation transistors of the pixel circuits in the (y+1)-th row and gate electrodes of the first reset transistor of the pixel circuits in the y-th row; and
the orthographic projection of the storage capacitor on the base substrate is between an orthographic projection of the first reset signal line on the base substrate and an orthographic projection of the second reset signal line on the base substrate,
wherein y is an integer greater than 1.

* * * * *